(12) United States Patent
Tsai et al.

(10) Patent No.: US 11,244,939 B2
(45) Date of Patent: Feb. 8, 2022

(54) PACKAGE STRUCTURE AND METHOD OF FORMING THE SAME

(71) Applicant: Taiwan Semiconductor Manufacturing Co., Ltd., Hsinchu (TW)

(72) Inventors: Chung-Hao Tsai, Changhua County (TW); Chen-Hua Yu, Hsinchu (TW); Chuei-Tang Wang, Taichung (TW); Wei-Ting Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1 day.

(21) Appl. No.: 16/830,282

(22) Filed: Mar. 26, 2020

(65) Prior Publication Data
US 2021/0305226 A1 Sep. 30, 2021

(51) Int. Cl.
*H01L 25/18* (2006.01)
*H01L 23/31* (2006.01)
(Continued)

(52) U.S. Cl.
CPC .............. *H01L 25/18* (2013.01); *H01L 21/56* (2013.01); *H01L 21/6835* (2013.01); *H01L 23/295* (2013.01); *H01L 23/3128* (2013.01); *H01L 23/481* (2013.01); *H01L 23/5383* (2013.01); *H01L 23/5386* (2013.01); *H01L 24/19* (2013.01); *H01L 24/24* (2013.01); *H01L 24/25* (2013.01); *H01L 24/82* (2013.01); *H01L 25/0657* (2013.01); *H01L 25/16* (2013.01);
(Continued)

(58) Field of Classification Search
CPC ... H01L 25/18; H01L 23/5383; H01L 23/295; H01L 24/24; H01L 21/56; H01L 25/0657; H01L 24/82; H01L 24/19; H01L 24/25; H01L 23/5386; H01L 23/481; H01L 25/16; H01L 25/50; H01L 23/3128; H01L 21/6835; H01L 2224/2518; H01L 2924/19105; H01L 2224/24137; H01L 2221/68372; H01L 2924/19041; H01L 2225/06565; H01L 2225/06541; H01L 2924/19011; H01L 2224/24195; H01L 2221/68359
See application file for complete search history.

(56) References Cited

U.S. PATENT DOCUMENTS 8,993,380 B2 3/2015 Hou et al.
9,000,584 B2 4/2015 Lin et al.
(Continued)

*Primary Examiner* — Mamadou L Diallo
(74) *Attorney, Agent, or Firm* — JCIPRNET

(57) ABSTRACT

Embodiments of the disclosure provide a package structure and method of forming the same. The package structure includes a first die, a first encapsulant, a first RDL structure, a die stack structure and a second encapsulant. The first encapsulant laterally encapsulates the first die. The first RDL structure is electrically connected to the first die, and disposed on a first side of the first die and the first encapsulant. The die stack structure is electrically connected to the first die and disposed on a second side of the first die opposite to the first side. The second encapsulant is located over the first (Continued)

encapsulant and laterally encapsulating the die stack structure. A sidewall of the first encapsulant is aligned with a sidewall of the second encapsulant.

20 Claims, 28 Drawing Sheets

(51) Int. Cl.
    *H01L 23/00*     (2006.01)
    *H01L 25/16*     (2006.01)
    *H01L 23/29*     (2006.01)
    *H01L 23/48*     (2006.01)
    *H01L 21/56*     (2006.01)
    *H01L 25/00*     (2006.01)
    *H01L 23/538*     (2006.01)
    *H01L 21/683*     (2006.01)
    *H01L 25/065*     (2006.01)

(52) U.S. Cl.
    CPC .... *H01L 25/50* (2013.01); *H01L 2221/68359* (2013.01); *H01L 2221/68372* (2013.01); *H01L 2224/24137* (2013.01); *H01L 2224/24195* (2013.01); *H01L 2224/2518* (2013.01); *H01L 2225/06541* (2013.01); *H01L 2225/06565* (2013.01); *H01L 2924/19011* (2013.01); *H01L 2924/19041* (2013.01); *H01L 2924/19105* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 * | 5/2017 | Chen .................... H01L 23/3135 |
| 9,735,131 B2 * | 8/2017 | Su ........................ H01L 25/0657 |
| 2017/0133351 A1 * | 5/2017 | Su ......................... H01L 25/105 |
| 2018/0294212 A1 * | 10/2018 | Chen ................. H01L 23/49811 |
| 2019/0244907 A1 * | 8/2019 | Liao ......................... H01L 24/19 |
| 2020/0006274 A1 * | 1/2020 | Chiang .................. H01L 21/568 |
| 2020/0357770 A1 * | 11/2020 | Chiang ............... H01L 25/0657 |
| 2021/0066254 A1 * | 3/2021 | Yu ........................... H01L 21/56 |
| 2021/0134692 A1 * | 5/2021 | Fang .................... H01L 23/3135 |
| 2021/0143143 A1 * | 5/2021 | Yu ........................... H01L 24/20 |

* cited by examiner

PACKAGE STRUCTURE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices, Chip-On-Wafer (CoW) packages, Chip-On-Wafer-On-Substrate (CoWoS) packages and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
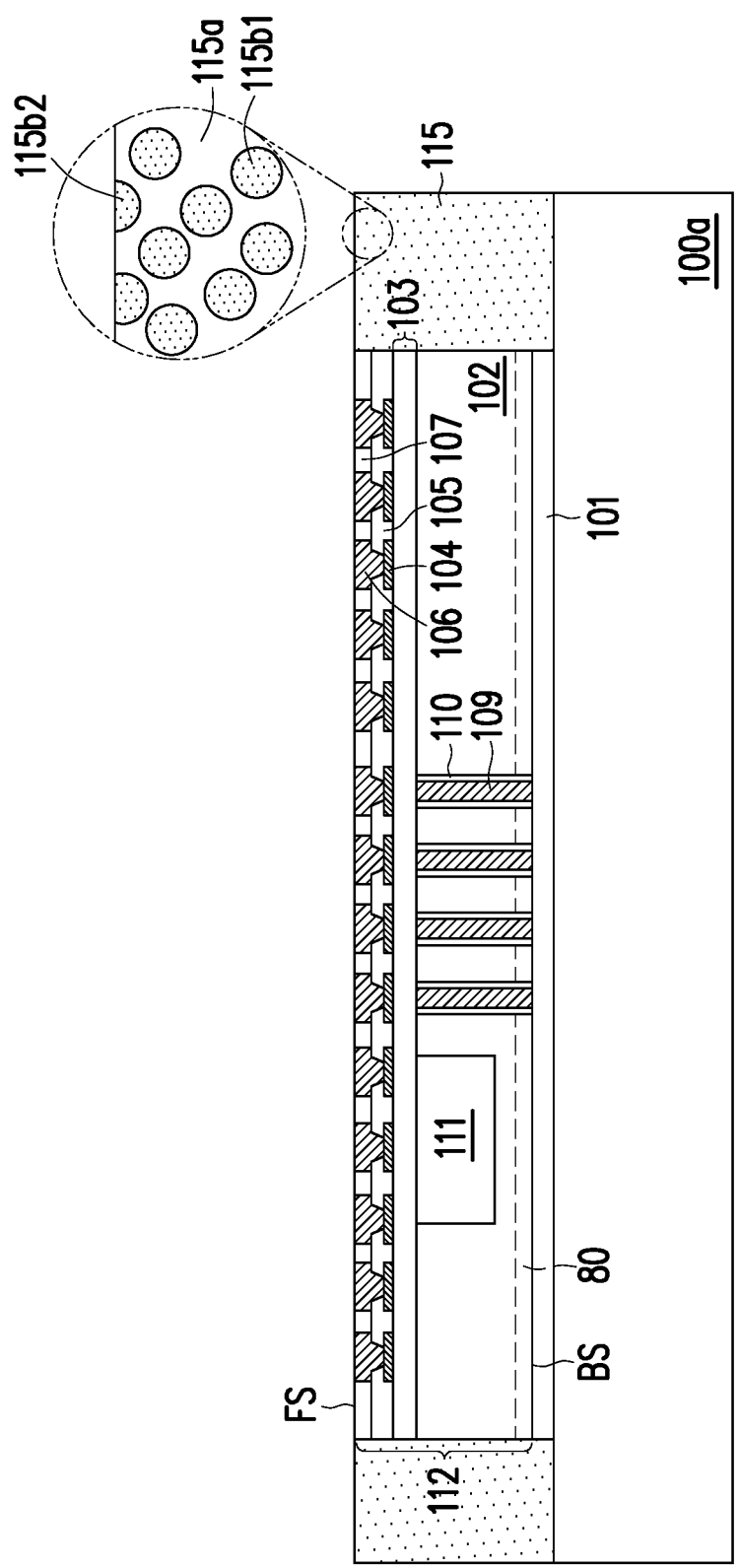
FIG. 1A to FIG. 1H are schematic cross-sectional views illustrating a method of forming a semiconductor structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a method of forming a semiconductor structure according to some embodiments of the disclosure.

Referring to FIG. 1A, a carrier 100a is provided. The carrier 100a may be a glass carrier, a ceramic carrier, or the like. The carrier 100a is a temporary carrier and may include a release layer (not shown) formed thereon. In some embodiments, the release layer may be formed of an adhesive such as an Ultra-Violet (UV) glue, a Light-to-Heat Conversion (LTHC) glue, or the like, or other types of adhesives. The release layer may be decomposable under the heat of light to thereby release the carrier 100a from the overlying structures in subsequent processes.

A die 112 is mounted over the carrier 100a by pick and place processes. In some embodiments, the die 112 is attached to the carrier 100a through an adhesive layer 101 such as a die attach film (DAF), silver paste, or the like. The adhesive layer 101 may has a width substantially equal to the width of the die 112. For example, the sidewalls of the adhesive layer 101 may be substantially aligned with the sidewalls of the die 112. In alternative embodiments, the width of the adhesive layer 101 may be larger than the width of the die 112 and may substantially equal to the width of the carrier 110a. In some embodiments, the die 112 is one of a plurality of dies cut apart from a wafer, for example. The die 112 may be any suitable type of die, such as a logic die, a memory die, a radio frequency die, an analog chip, a sensor chip, a power management die, a voltage regulator chip, a micro-electro-mechanical-system (MEMS) die, a system on chip (SoC), a CPU, a GPU, an xPU, or the like. In an embodiment, the die 112 is a logic die. The number of the die 112 mounted on the carrier 100a shown in FIG. 1A is merely for illustration, and the disclosure is not limited thereto. In some embodiments, two or more dies (e.g. dies 112a and 112b shown in FIG. 2B) may be disposed side by side on the carrier 100a, and the two or more dies may be the same types of dies or different types of dies. In some embodiments, other semiconductor components such as integrated passive devices (IPD) (e.g. IPD 500 shown in FIG. 8, FIG. 9) may also be disposed aside the die 112 to be integrated with the die 112 is subsequent processes. In some embodiments, a plurality of conductive vias (e.g. conductive vias 12 shown in FIG. 2B, FIG. 8, FIG. 9) may be formed on the carrier 100a before mounting the die 112, and the conductive vias are configured as laterally aside the die 112.

Still referring to FIG. 1A, in some embodiments, the die 112 includes a substrate 102, an interconnection structure 103, a plurality of pads 104, a passivation layer 105, a plurality of connectors 106 and a passivation layer 107. The die 112 has a front surface FS and a back surface BS opposite to each other. Throughout the disclosure, a "front surface" of a die refers to a surface having conductive connectors or close to connectors, and may also be referred to as an active surface; a "back surface" of a die is a surface opposite to the front surface and may be a surface of the substrate, which may also be referred to as a rear surface.

In some embodiments, the substrate 102 is a semiconductor substrate made of silicon or other semiconductor materials. Alternatively or additionally, the substrate 102 includes other elementary semiconductor materials such as germanium, gallium arsenic, or other suitable semiconductor materials. In some embodiments, the substrate 102 may further include other features such as various doped regions, a buried layer, and/or an epitaxy layer. Moreover, in some embodiments, the substrate 102 is made of an alloy semiconductor such as silicon germanium, silicon germanium carbide, gallium arsenic phosphide, or gallium indium phosphide. Furthermore, the substrate 102 may be a semiconductor on insulator such as silicon on insulator (SOI) or silicon on sapphire.

In some embodiments, a plurality of devices are formed in and/or on the substrate 102. The devices may include active devices, passive devices, or combinations thereof. In some embodiments, the devices are integrated circuit devices. The devices are, for example, transistors, capacitors, resistors, diodes, photodiodes, fuse devices, or the like, or combinations thereof.

In some embodiments, the interconnection structure 103 is formed on the substrate 102 to electrically connect the various devices to form a functional circuit. The interconnection structure 103 may include a metallization structure embedded in a dielectric structure (not shown). The dielectric structure may include a plurality of dielectric layers, such as inter-layer dielectric layers (ILDs) and inter-metal dielectric layers (IMDs). In some embodiments, the dielectric structure is an inorganic dielectric structure. Additionally or alternatively, the dielectric structure may include organic dielectric material. For example, the material of the dielectric structure may include silicon oxide, silicon nitride, silicon oxynitride, silicon carbide, low-K dielectric material, such as un-doped silicate glass (USG), phosphosilicate glass (PSG), boron-doped phosphosilicate glass (BPSG), fluorinated silica glass (FSG), $SiO_xC_y$, Spin-On-Glass, Spin-On-Polymers, silicon carbon material, compounds thereof, composites thereof, combinations thereof, or the like.

The metallization structure includes multiple conductive features interconnected to each other and embedded in the dielectric structure. The conductive features may include multi-layers of conductive lines, conductive vias, and conductive contacts. The conductive contacts may be formed in the ILDs to electrically connect the conductive line to the devices; the conductive vias may be formed in the IMDs to electrically connect the conductive lines in different layers. The conductive features of the interconnection structure 103 may include metal, metal alloy or a combination thereof. For example, the conductive features may include tungsten (W), copper (Cu), copper alloys, aluminum (Al), aluminum alloys, or combinations thereof.

The pads 104 are electrically connected to a top conductive feature of the interconnection structure 103, and further electrically connected to the devices formed on/in the substrate 102 through the interconnection structure 103. The material of the pads 104 may include metal or metal alloy, such as aluminum, copper, nickel, or alloys thereof.

The passivation layer 105 is formed over the substrate 102 and covers portions of the pads 104. Other portions of the pads 104 are exposed by the passivation layer 105. The connectors 106 are formed on and electrically connected to the pads 104 not covered by the passivation layer 105. The connector 106 includes copper bumps, copper posts, copper pillars, solder bumps, gold bumps, or other suitable metallic bumps, or the like. In an embodiment, the pads 104 are aluminum pads, and the connectors 106 are copper pillars. In some embodiments, the connectors 106 may also be referred to as input/output (I/O) connectors of the die 112. The passivation layer 107 is formed over the passivation layer 105 and laterally aside the connectors 106 to cover the sidewalls of the connectors 106. The passivation layers 105 and 107 may respectively include an insulating material such as silicon oxide, silicon nitride, polymer, or a combination thereof. The polymer may include polybenzoxazole (PBO), polyimide (PI), benzocyclobutene (BCB), the like, or combinations thereof. The materials of the passivation layer 105 and the passivation layer 107 may be the same or different. In an embodiment, the passivation layer 105 includes silicon nitride, and the passivation layer 107 includes a polymer material such as PI. In some embodiments, the top surface of the passivation layer 107 and the top surfaces of the connectors 106 are substantially coplanar with each other.

In some embodiments, the die 112 includes a plurality of conductive vias 109 formed in the substrate 102 and electrically connected to the interconnect structure 103. In some embodiments, a plurality of liners 110 are disposed between the conductive vias 109 and the substrate 102. The liner 110 may surrounds the sidewalls of the conductive via 109 to separate the conductive via 109 from the substrate 102. The conductive via 109 may include copper, copper alloys, aluminum, aluminum alloys, Ta, TaN, Ti, TiN, CoW or combinations thereof. The liner 110 may include dielectric material, such as silicon oxide, silicon nitride, silicon oxynitride or the like, or combinations thereof. The conductive vias 109 may extend into the interconnect structure 103 to be in physical and electrical contact with the conductive features of the interconnect structure 103. In some embodiments, as shown in FIG. 1A, the conductive vias 109 may extend through the substrate 102 and have been revealed from the back surface BS of the die 112 when mounted to the carrier 100a, and the bottom surfaces of the conductive vias 109, the liners 110 may be substantially coplanar with the bottom surface of the substrate 102. In such embodiment, the conductive via 109 may also be referred to as a through substrate via (TSV). In alternative embodiments in which the conductive vias 109 are revealed, an isolation layer 80 may be disposed on back surface of the substrate 102 and laterally surrounding the TSVs 109 and/or the liners 110. The isolation layer 80 may include a dielectric material such as silicon oxide, silicon nitride, silicon oxynitride, or the like or combinations thereof. It is noted that, the isolation layer 80 is illustrated in dashed line which represents that it is optionally formed. In yet another embodiment, a dielectric layer and conductive pads (e.g. the dielectric layer 82 and conductive pads 83 shown in FIG. 2H) may further be formed on back side of the substrate 102. In the embodiments in which the die 112 includes the isolation layer 80, the bottom surfaces of the TSVs 109 may be substantially coplanar with the bottom surface of the isolation layer 80.

However, the disclosure is not limited thereto. In alternative embodiments, the conductive vias 109 may be embedded in the substrate 102 without being revealed when mounted to the carrier 100a. For example, the sidewalls and bottom surfaces of the conductive vias 109 may be covered by the substrate 102, and the liners 110 may surround the sidewalls and bottom surfaces of the conductive vias 109 to be interposed between the conductive vias 109 and the substrate 102. It is noted that, the conductive vias 109 may be optionally formed in the die 112. In some embodiments, the die 112 may be free of the conductive vias 109.

In some embodiments, the die 112 may optionally include a functional circuit 111. The functional circuit 111 may be functioned as a physical layer (PHY). The functional circuit 111 may be electrically connected to the interconnection structure 103 and further electrically connected to I/O connectors 106. The functional circuit 111 may be used for signal and/or data transmitting.

Still referring to FIG. 1A, in some embodiments, an encapsulant 115 is formed on the carrier 100a to laterally encapsulate sidewalls of the die 112. In some embodiments, the encapsulant 115 further encapsulates sidewalls of the adhesive layer 101. In alternative embodiments in which the adhesive layer 101 has a width substantially the same as the width of the carrier 100a, the encapsulant 115 is formed on the adhesive layer 101 and covers a portion of the top surface of the adhesive layer 101. In yet alternative embodiments in which other semiconductor components (such as semiconductor dies or IPD) and/or conductive vias are disposed laterally aside the die 112, the encapsulant 115 is formed to further encapsulate sidewalls of the other semiconductor components and/or the conductive vias.

The encapsulant 115 may include a molding compound, a molding underfill, a resin such as epoxy, a combination thereof, or the like. In some other embodiments, the encapsulant 115 includes a polymer material such as polybenzoxazole (PBO), polyimide (PI), benzocyclobutene (BCB), a combination thereof, or the like. In alternative embodiments, the encapsulant 115 may include inorganic dielectric material. For example, the encapsulant 115 may include nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 115 includes a molding compound, and may be formed by an over-molding process and a planarization process. For example, an encapsulant material layer is formed over the carrier 100a to encapsulate sidewalls and the top surface (i.e. front surface FS) of the die 112 through an over-molding process. Thereafter, a planarization process such as a chemical mechanical polishing (CMP) process is performed to remove a portion of the encapsulant material layer over the front surface FS of the die 112 to expose the die 112, and the encapsulant 115 is formed. In some embodiments, the top surface of the encapsulant 115 is substantially coplanar with the front surface FS of the die 112.

In some embodiments, the encapsulant 115 is a composite material including a base material 115a (such as polymer) and a plurality of fillers 115b1 and 115b2 distributed in the base material 115a. In some embodiments, the base material 115a includes resins, such as epoxy resins, phenolic resins or silicon-containing resins, or the like or combinations thereof. The fillers 115b1 and 115b2 may include a single element, a compound such as nitride, oxide, or a combination thereof. The fillers 115b1 and 115b2 may include silicon oxide, aluminum oxide, boron nitride, alumina, silica, or the like, for example. In some embodiments, the fillers may be spherical filler particles. The cross-section shape of the filler may be circle, oval, or any other suitable shape. The fillers may include solid fillers, hollow fillers or a combination thereof. In some embodiments, the fillers 115b1 are surrounded by the base material 115a and have rounded surfaces. In some embodiments, some of the fillers, such as the fillers 115b2 near the top surface of the encapsulant 115 are partially removed by the planarization process, and hence have substantially planar top surfaces. The planar top surfaces of the fillers 115b2 are exposed by the base material 115a, and are substantially coplanar with the top surface of the base material 115a and the front surface FS of the die 112. The planar top surfaces of the fillers 115b2 will be in contact with a polymer layer 117 (FIG. 1B) subsequently formed thereon.

Figure 1B:
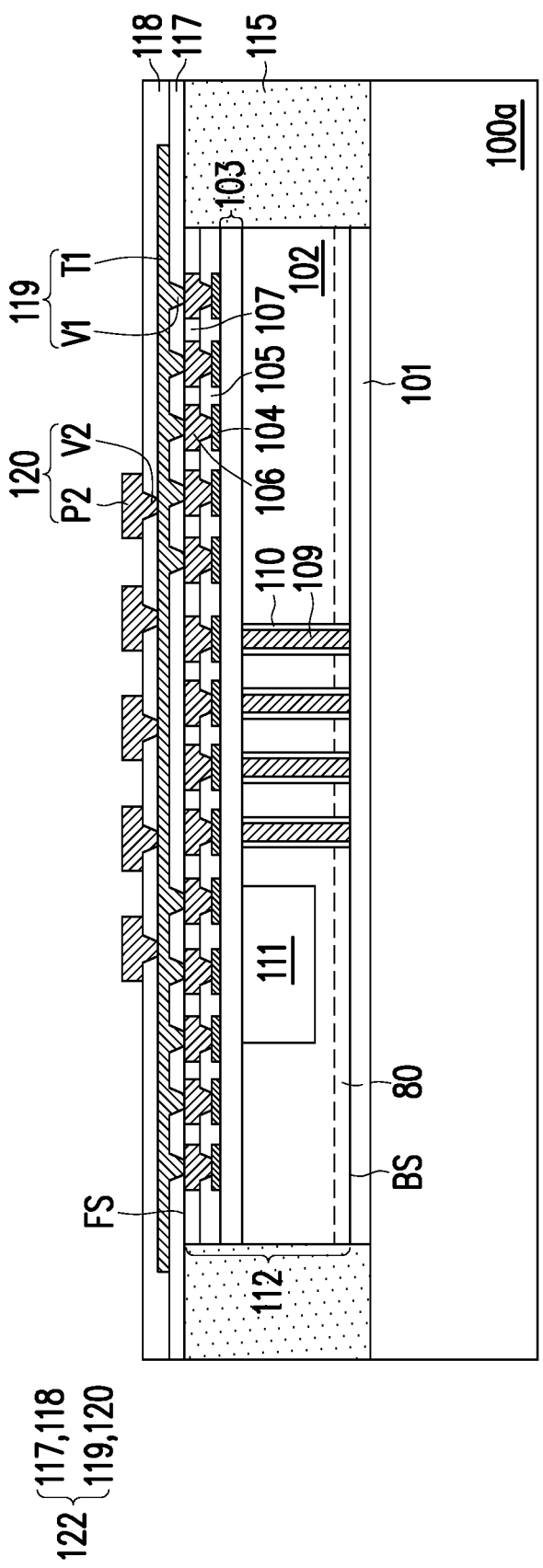

Referring to FIG. 1B, in some embodiments, a redistribution layer (RDL) structure 122 is then formed on the die 112 and the encapsulant 115 to electrically connect to the die 112. In alternative embodiments in which other semiconductor components and/or conductive vias are formed laterally aside the die 112 and encapsulated by the encapsulant 115, the RDL structure 122 is also electrically connected to the semiconductor components and/or the conductive vias. Since the RDL structure 122 is formed on the front surface FS of the die 112, the RDL structure 122 may also be referred to as a "front-side RDL structure". In some embodiments, the RDL structure 122 includes a plurality of polymer layers 117 and 118 and a plurality of redistribution layers 119 and 120 stacked alternately. The numbers of the polymer layers and the redistribution layers shown in the figures are merely for illustration, and the disclosure is not limited thereto.

The polymer layer 117 is formed on and in contact with the front surface FS of the die 112 and the top surface of the encapsulant 115. The redistribution layer 119 penetrates through the polymer layer 117 to electrically connect to the connectors 106 of the die 112. The polymer layer 118 is formed on the polymer layer 117 and the redistribution layer 119. The redistribution layer 120 penetrates through the polymer layer 118 to electrically connect to the redistribution layer 119.

In some embodiments, each of the polymer layers 117 and 118 includes a photo-sensitive material such as polybenzoxazole (PBO), polyimide (PI), benzocyclobutene (BCB), a combination thereof or the like. In some embodiments, each of the redistribution layers 119 and 120 includes conductive materials. The conductive materials include metal such as copper, aluminum, nickel, titanium, alloys thereof, a combination thereof or the like. In some embodiments, the redistribution layers 119 and 120 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

In some embodiments, the redistribution layer 119 includes a plurality of vias V1 and traces T1 connected to each other. The vias V1 are embedded in and penetrating through the polymer layer 117 to be in physical and electrical contact with the connectors 106 of the die 112. The traces T1 are located on the vias V1 and extending on the top surface of the polymer layer 117 to connect to the connectors 106 of the die 112 through the vias V1. The redistribution layer 120 may include a plurality of vias V2 and a plurality of protrusions P2 on the vias V2. The vias V2 are embedded in and penetrating through the polymer layer 118 to be in contact with the redistribution layer 119. The protrusions P2 are located on the vias V2 and protrude from the top surface of the polymer layer 118. In some embodiments, the protrusions P2 are conductive pillars, but the disclosure is not limited thereto. The sidewalls of the vias V1 and V2 may be straight or inclined. In some embodiments, the vias V1 and the vias V2 have inclined sidewalls, and are tapered toward the die 112. In some embodiments, a polymer layer (e.g. the polymer layer PL shown in FIG. 3A) may further be formed on the polymer layer 118 to at least cover sidewalls of the protrusions P2 of the redistribution layer 120.

Figure 1C:
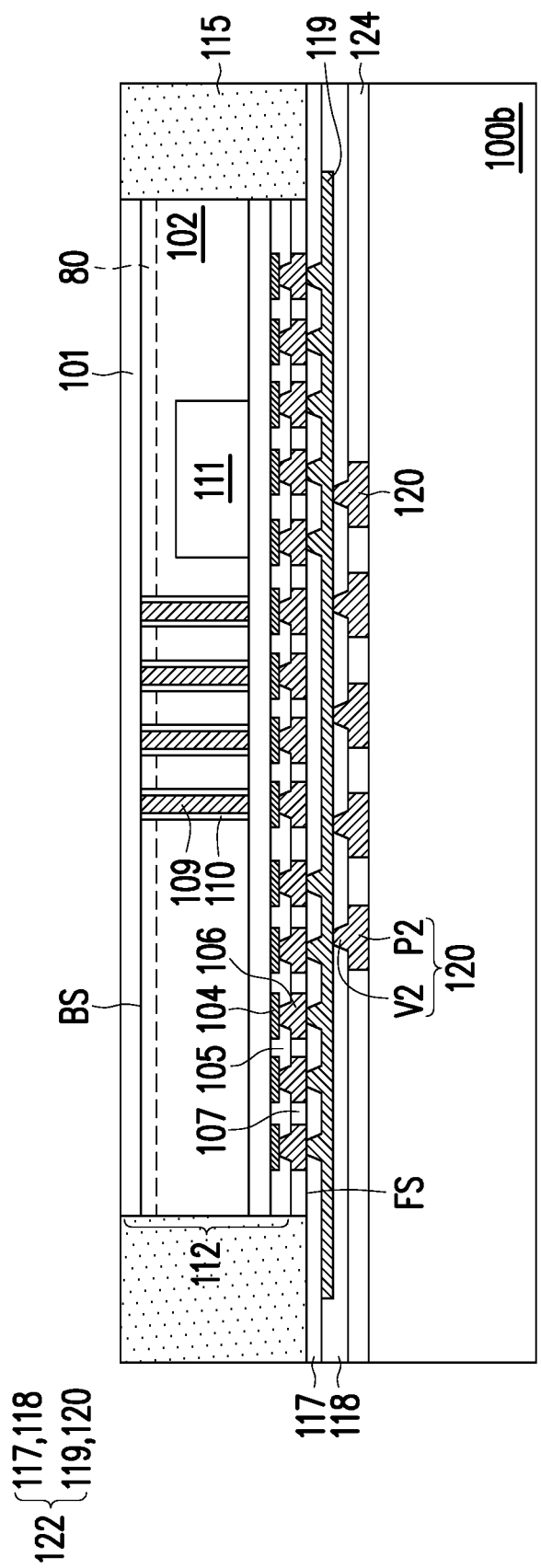

Referring to FIG. 1B to FIG. 1C, in some embodiments, after the front side RDL structure 122 is formed, the carrier 100a is released from the overlying structure. For example, a de-bonding process is performed to release the carrier 100a from the overlying structure. The de-bonding process may include applying a UV light or a laser on the release layer of the carrier 100a, such that the release layer is decomposed under the heat of light or laser, thereby releasing the carrier 100a. Thereafter, the structure over the carrier 100a shown in FIG. 1B is flipped upside down and mounted over a carrier 100b with the back surface BS of the die 112 facing upward.

Referring to FIG. 1C, in some embodiments, the structure including the die 112, the encapsulant 115 and the RDL structure 122 is attached to the carrier 100b through an adhesive layer 124. The carrier 100b is a temporary carrier and may include a material similar to that of the carrier 100a. Similar to the carrier 100a, the carrier 100b may also have a release layer formed thereon. The adhesive layer 124 may include a material similar to that of the adhesive layer 101. In some embodiments, the redistribution layer 120 and the polymer layer 118 are in contact with the adhesive layer 124, and the protrusions P2 of the redistribution layer 120 may be embedded in the adhesive layer 124. In alternative embodiments in which a polymer layer (e.g. the polymer layer PL shown in FIG. 3A) is formed laterally aside the protrusions P2 of the redistribution layer 120, the bottom surfaces of the redistribution layer 120 and the polymer layer are in contact with the adhesive layer 124.

Figure 1D:
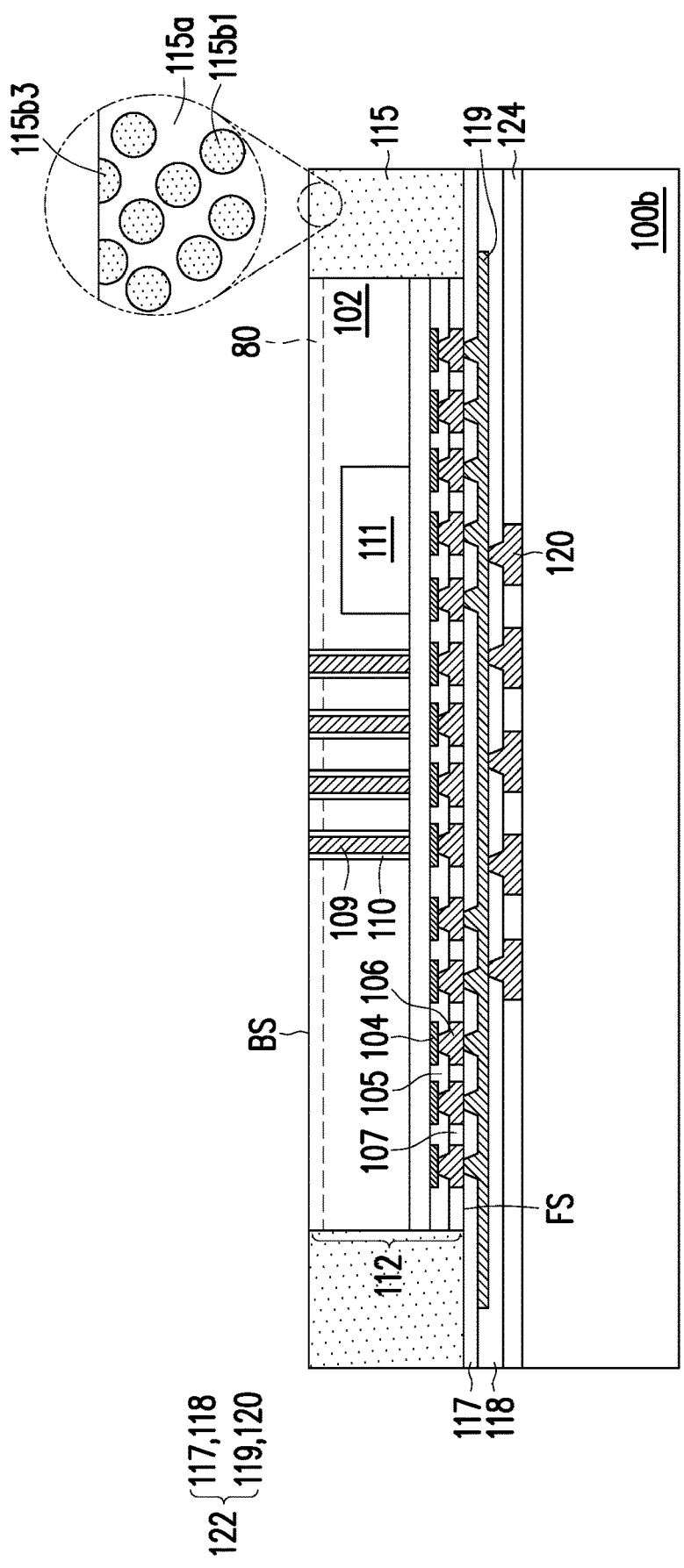

As shown in FIG. 1C, the back surface BS of the die 112 faces upward and is covered by the adhesive layer 101. Referring to FIG. 1C to FIG. 1D, in some embodiments, a planarization process is performed to remove the adhesive layer 101 and/or a portion of the encapsulant 115, so as to expose the back surface BS of the die 112 and reveal the conductive vias 109 of the die 112. The planarization process may include a grinding process and/or a polishing process such as a CMP process. In some embodiments in which the adhesive layer 101 is laterally encapsulated by the encapsulant 115, the adhesive layer 101 and a portion of the encapsulant 115 laterally aside the adhesive layer 101 are removed by the planarization process. In some embodiments in which the adhesive layer 101 has a width substantially equal to the width of the previous carrier 100a (FIG. 1A), the adhesive layer 101 may be removed by a cleaning process, while the planarization process may or may not be performed.

In some embodiments in which the conductive vias 109 of the die 112 are not revealed before mounting to the carrier 100a, the revealing of the conductive vias 109 may be implemented through this planarization process. For example, after removing the adhesive layer 115, the planarization process may further remove a portion of the substrate 102 of the die 112, a portion of liners 110 on top of the conductive vias 109 and a portion of the encapsulant 115 laterally aside the die 112, so as to reveal the conductive vias 109.

Still referring to FIG. 1D, in some embodiments, after the planarization process is performed, the top surface of the encapsulant 115 is substantially coplanar with the back surface BS of the die 112 (e.g. top surfaces of the substrate 102, the conductive vias 109 and the liners 110, or the top surfaces of the isolation layer 80, the conductive vias 109 and/or the liners 110). In some embodiments in which a portion of the encapsulant 115 is removed by the planarization process, some of the fillers, such as the fillers 115b3 of the encapsulant 115 may be partially removed by the planarization process and hence have substantially planar top surfaces exposed at the top of the encapsulant 115 and substantially coplanar with the back surface BS of the die 112. The planar top surfaces of the fillers 115b3 will be in contact with a polymer layer 127 (FIG. 1E) subsequently formed thereon. As such, in the structure shown in FIG. 1D, some fillers 115b3 at the top of the encapsulant 115 have planar top surfaces substantially coplanar with the back surface BS (i.e. top surface) of the die 112, and some fillers 115b2 (shown in FIG. 1A) at the bottom of the encapsulant 115 have planar bottom surfaces substantially coplanar with the front surface FS (i.e. bottom surface) of the die 112.

Figure 1E:
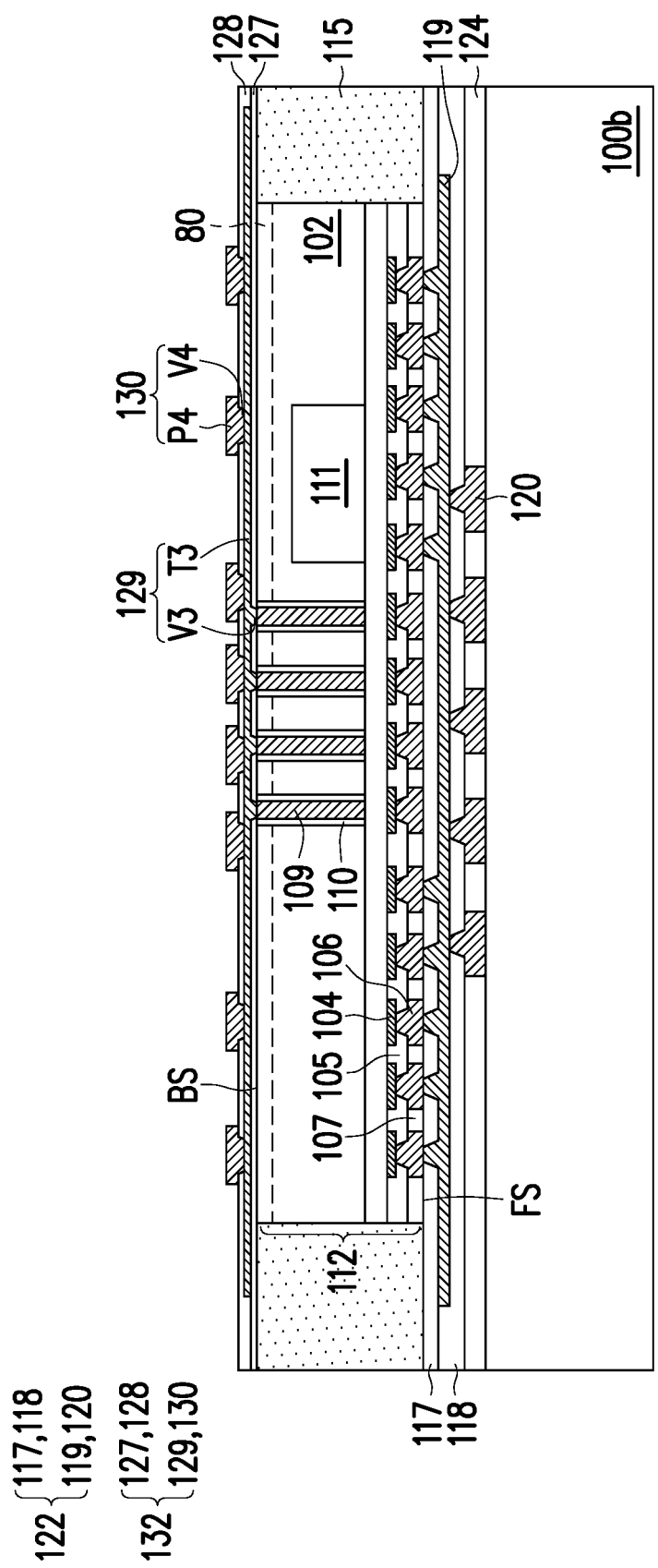

Referring to FIG. 1E, a RDL structure 132 is formed on the die 112 and the encapsulant 115 and electrically connected to die 112. Since the RDL structure 132 is formed on the back surface BS of the die 112, the RDL structure 132 may also be referred to as a "back side RDL structure" which is opposite to the front side RDL structure 122. In some embodiments, the RDL structure 132 includes a plurality of polymer layers 127 and 128 and a plurality of redistribution layers 129 and 130 stacked alternately. It should be understood that the numbers of the polymer layers and the redistribution layers included in the RDL structure 132 shown in the figures are merely for illustration, and the disclosure is not limited thereto.

In some embodiments, the polymer layer 127 is formed on and in contact with the back surface BS of the die 112 and the top surface of the encapsulant 115. The redistribution layer 129 penetrates through the polymer layer 127 to connect to TSVs 109 of the die 112. The polymer layer 128 is formed on the polymer layer 127 and the redistribution layer 129. The redistribution layer 130 penetrates through the polymer layer 128 to connect to the redistribution layer 129. The materials of the polymer layers 127, 128 and the redistribution layers 129, 130 of the RDL structure 132 are similar to, and may be the same as or different from those of the polymer layers 117, 118 and the redistribution layers 119, 120 of the RDL structure 122, respectively.

In some embodiments, the redistribution layer 129 includes a plurality of vias V3 and traces T3 electrically connected to each other. The vias V3 are embedded in and penetrating through the polymer layer 127 to be in physical and electrical contact with the TSVs 109 of the die 112. The bottom width of the via V3 may be less than, equal to or larger than the top width of the corresponding TSV 109. In other words, the top surface of the TSV 109 may partially or completely contact the bottom surface of the corresponding via V3. In some embodiments, the via V3 may contact the TSV 109 and further contact the liner 110. In some embodiments in which the die 112 is free of the isolation layer 80, the bottom width and location of the via V3 may be controlled such that the via V3 does not contact the substrate 102, thereby avoiding the conductive material diffusing from the via V3 to the substrate 102. In alternative embodiments in which the die 112 includes the isolation layer 80, the presence of the isolation layer 80 may help to avoid the diffusion of conductive material from the via V3 to the substrate 102 if the edges of the via V3 extends beyond the sidewalls of the liner 110. The traces T3 are located on the vias V3 and extending on the top surface of the polymer layer 127. The traces T3 are electrically connected to the TSVs 110 through the vias V3.

In some embodiments, the redistribution layer 130 may include a plurality of vias V4 and a plurality of protrusions P4 on the vias V4. The vias V4 are embedded in and penetrating through the polymer layer 128 to be in contact with the redistribution layer 129. The protrusions P4 are located on the vias V4 and protrude from the top surface of the polymer layer 128. In some embodiments, the protrusions P4 are conductive pillars, but the disclosure is not limited thereto. The sidewalls of the vias V3 and the vias V4 may be straight or inclined. In some embodiments, the vias V3 and V4 have inclined sidewalls and are tapered toward the die 112.

Figure 1F:
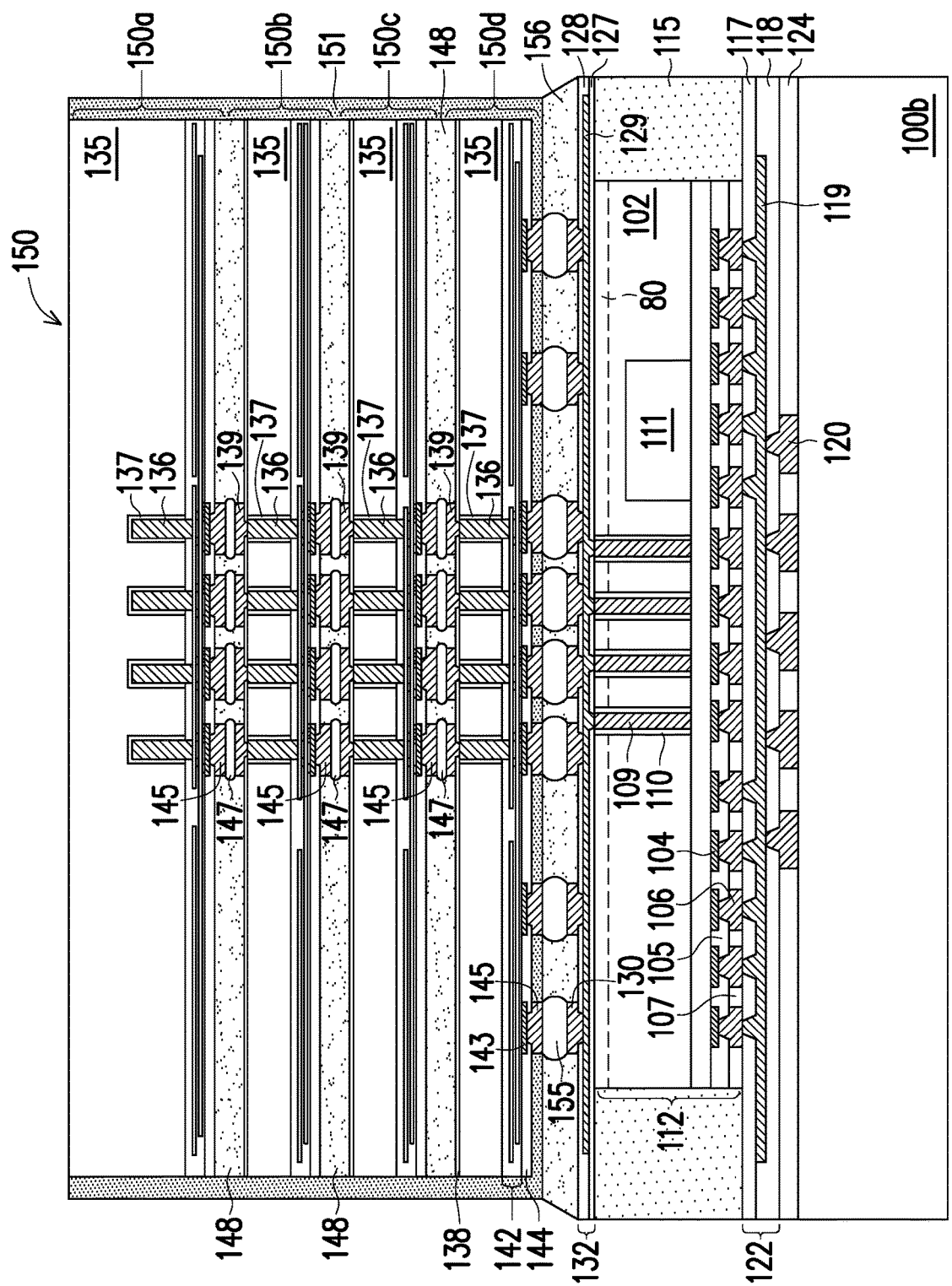

Referring to FIG. 1F, in some embodiments, a die stack structure 150 is then mounted to the RDL structure 132. In some embodiments, the die stack structure 150 includes a plurality of dies (such as the dies 150a, 150b, 150c, 150d) stacked upon one another. It is noted that, the number of dies included in the die stack structure 150 shown in the figures is merely for illustration, and the disclosure is not limited thereto. In alternative embodiments, the die stack structure 150 may include a single die or more than four dies. The dies 150a-150d may be electrically bonded to each other through any suitable techniques.

Each of the dies 150a-150d may be a logic die, a memory die, a radio frequency die, an analog chip, a sensor chip, a power management die, a voltage regulator chip, a micro-electro-mechanical-system (MEMS) die, a system on chip (SoC), a CPU, a GPU, an xPU, or the like or other suitable type of die. The dies 150a-150d may be the same types of dies or different types of dies. In some embodiments, the dies 150a-150d of the die stack structure 150 and the die 112 are different types of dies and perform different functions. For example, the die 112 is a logic die, while the dies 150a-150d are memory dies such as dynamic random access memory (DRAM) dies, static random access memory (SRAM) dies, other suitable dies, or combinations thereof. The die stack structure 150 may also be referred to as a memory cube. The die stack structure 150 may function as a high bandwidth memory (HBM) and controlled by the logic die 112.

In some embodiments, the dies 150a-150d have similar structures. For example, each of the dies 150a-150d includes a substrate 135, a plurality of conductive vias 136 and dielectric liners 137, an interconnection structure 142, a plurality of pads 143, a passivation layer 144, and a plurality of connectors 145. The materials of the substrate 135, the conductive vias 136, the dielectric liners 137, the interconnection structure 142, the pads 143, the passivation layer 144 and the connectors 145 may respectively be selected from the same candidate materials as those of the die 112, which are not described in detail here.

The substrate 135 is a semiconductor substrate. A plurality of devices, such as memory devices may be formed in and/or on the substrate 135. The memory devices may include DRAM devices, SRAM devices, other suitable devices or combinations thereof. The interconnection structure 142 is formed on the substrate 135 and includes a metallization structure embedded in a dielectric structure. The metallization structure electrically connects the devices to form a functional circuit, and may include multiple layers of conductive lines and conductive vias interconnected to each other. The pads 143 are formed on and electrically connected to the interconnection structure 142. The passivation layer 144 partially covers the pads 143 and exposes portions of the pads 143. The connectors 145 are formed on the pads 143 exposed by the passivation layer 144 and electrically connected to the pads 143.

In some embodiments, the conductive vias 136 are embedded in the substrate 135 and electrically connected to the interconnection structure 142. The conductive vias 136 are separated from the substrate 135 by the dielectric liners 137 therebetween. In some embodiments, the conductive vias 136 of the dies 150b-150d penetrate through the substrate 135 to be revealed at the back surface of the substrate 135, and may also be referred to as TSVs. In some embodiments, the dies 150b-150d may further include conductive pads 139 disposed on back surface of the substrate 135 and electrically connected to the TSVs 136. The materials of the conductive pads 139 may include metal such as copper, aluminum, nickel, titanium, alloys thereof, combinations thereof or the like. In some embodiments, an isolation layer 138 is disposed on the back surface of the substrate 135 to separate the conductive pads 139 from the substrate 135. The conductive pads 139 penetrate through the isolation layer 138 to connect to the TSVs 136. The isolation layer 138 may include an inorganic dielectric material such as silicon oxide, silicon nitride, silicon oxynitride, or the like or combinations thereof. In some embodiments, the material of the isolation layer 138 is the same as the material of the dielectric liner 137.

In some embodiments, the die 150a is the topmost die of the die stack structure 150, and the conductive vias 136 of the die 150a are not revealed from the back surface of the substrate 135. The die 150a is free of the conductive pads 139 and the isolation layer 138. In alternative embodiments, the topmost die 150a may be free of conductive vias 136.

In some embodiments, the dies 150a-150d are electrically connected to each other through connectors 147. The connectors 147 may be micro bumps. In some embodiments, the connectors 147 may include solder bumps, silver bumps, copper bumps, or any other suitable metallic bumps. For example, the connectors 147 are disposed between the connectors 145 of one of the dies 150a-150d and the conductive pads 139 of another one of the dies 150a-150d to provide the electrical connection between the dies. In the illustrated embodiment, the dies 150a-150d are configured as face to back, but the disclosure is not limited thereto. The dies 150a-150d may be stacked on one another in face-to-face configuration, back-to-back configuration, face-to-back configuration, or combinations thereof. Other connection method may also be used to electrically connect the dies. For example, the dies 150a-150d may be electrically bonded to each other through hybrid bonding.

In the embodiments in which the dies 150a-150d are connected to each other through connectors 147, underfill layers 148 are formed to fill the space between two adjacent dies of the dies 150a-150d. Each of the underfill layers 148 laterally surrounds the conductive pads 139, the connectors 145 and the connectors 147.

In some embodiments, the die stack structure 150 may optionally include an encapsulant 151 encapsulating the dies 150a-150d and the underfill layers 148. The material of the encapsulant 151 is similar to, and may be the same as or different from the material of the encapsulant 115. For example, the encapsulant 151 is a molding compound including a base material such as polymer material and fillers distributed in the base material. The materials of the base material and fillers are substantially the same as those of the encapsulant 115.

In some embodiments, the encapsulant 151 encapsulates sidewalls of the dies 150a-150d, sidewalls of the underfill layers 148, and may further encapsulant the bottom surface (e.g. front surface) of the bottommost die 150d and laterally encapsulates the connectors 145 of the die 150d. In some embodiments, the bottom surface of the encapsulant 151 is substantially coplanar with the bottom surfaces of the connectors 145 of the die 150d, and the top surface of the encapsulant 151 may be substantially coplanar with the top surface (e.g. back surface) of the topmost die 150a.

Still referring to FIG. 1F, in some embodiments, the die stack structure 150 is electrically bonded to the RDL structure 132 through a plurality of connectors 155. The connectors 155 may be micro bumps. In some embodiments, the connectors 155 may include solder bumps, silver bumps, copper bumps, or any other suitable metallic bumps. The die stack structure 150 may be bonded to the RDL structure 132 in a flip-chip manner. For example, the surface of the die stack structure 150 having the connectors 145 may be referred to as the front surface F1 of the die stack structure 150. In the present embodiments, the bottom surfaces of the connectors 145 of the die 150d and the bottom surface of the encapsulant 151 constitute the front surface F1 of the die stack structure 150. The surface of the die stack structure 150 opposite to the front surface F1 is the back surface F2 of the die stack structure 150. In the present embodiment, the top surface of the substrate 135 of the die 150a and the top surface of the encapsulant 151 constitute the back surface F2 of the die stack structure 150. In some embodiments, the die stack structure 150 is bonded to the RDL structure 132 with the front surface F1 thereof facing the RDL structure 132 and the die 112. In some embodiments, the connectors 155 may be disposed between the connectors 145 of the die 150a and the redistribution layer 130 of the RDL structure 132 to provide the electrical connection therebetween. However, the disclosure is not limited thereto.

In some embodiments, after the die stack structure 150 is bonded to the RDL structure 132, an underfill layer 156 is formed to fill the space between the die stack structure 150 and the RDL structure 132. The underfill layer 156 may be formed by a dispensing process. In some embodiments, the underfill layer 156 laterally surrounds the redistribution layers 130 and the connectors 155, and covers the top surface of the redistribution structure 132 and the bottom surface (e.g. front surface F1) of the die stack structure 150. The top surface of the RDL structure 132 may be partially or completely covered by the underfill layer 156. The bottom width of the underfill layer 156 may be substantially equal to or less than the top width of the RDL structure 132.

Figure 1G:
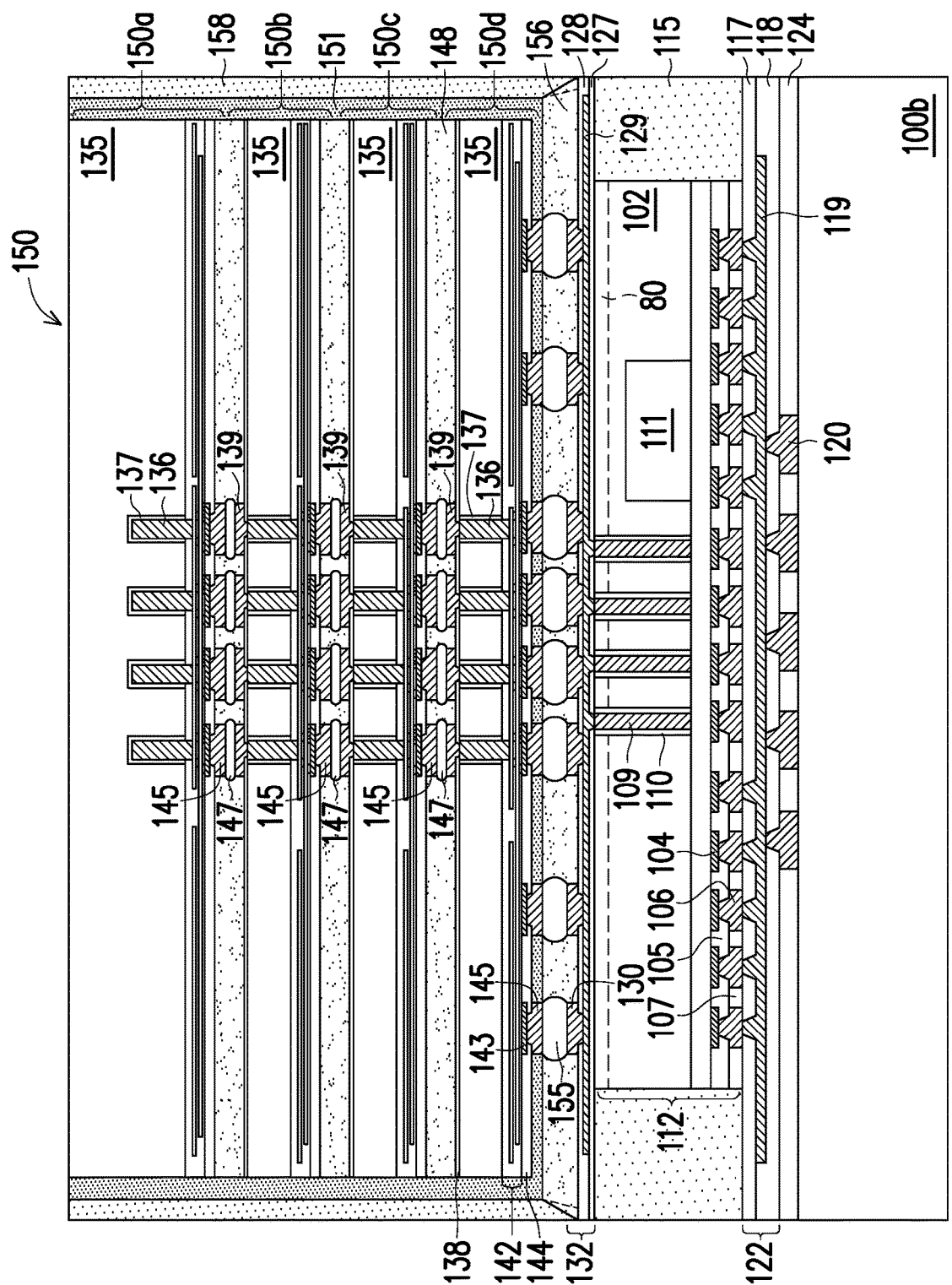

Referring to FIG. 1G, in some embodiments, thereafter, an encapsulant 158 is formed on the RDL structure 132 to laterally encapsulate the die stack structure 150 and the underfill layer 156. The material of the encapsulant 158 is similar to, and may be the same as or different from those of the encapsulant 115. For example, the encapsulant 158 is a molding compound including a base material such as polymer material and fillers distributed in the base material. The materials of the base material and fillers are substantially the same as those of the encapsulant 115. The encapsulant 158 may be formed by an over-molding process and a planarization process. For example, an encapsulant material layer is formed on the RDL structure 132 to encapsulate sidewalls of the underfill layer 156, sidewalls and top surface of the die stack structure 150 by the over-molding process. Thereafter, the planarization process (e.g. CMP process) is performed to remove a portion of the encapsulant material layer over the top surface of the die stack structure 150. In some embodiments, the top surface of the encapsulant 158 is substantially coplanar with the top surface (e.g. back surface F2) of the die stack structure 150. The bottom surface of the encapsulant 158 may be separated from the top surface of the RDL structure 132 by the underfill layer 156 therebetween. Alternatively, in the embodiments in which the underfill layer 156 has edges shown as the dotted line, the bottom surface of the encapsulant 158 may be in contact with the top surface of the polymer layer 128 of the RDL structure 132.

Figure 1H:
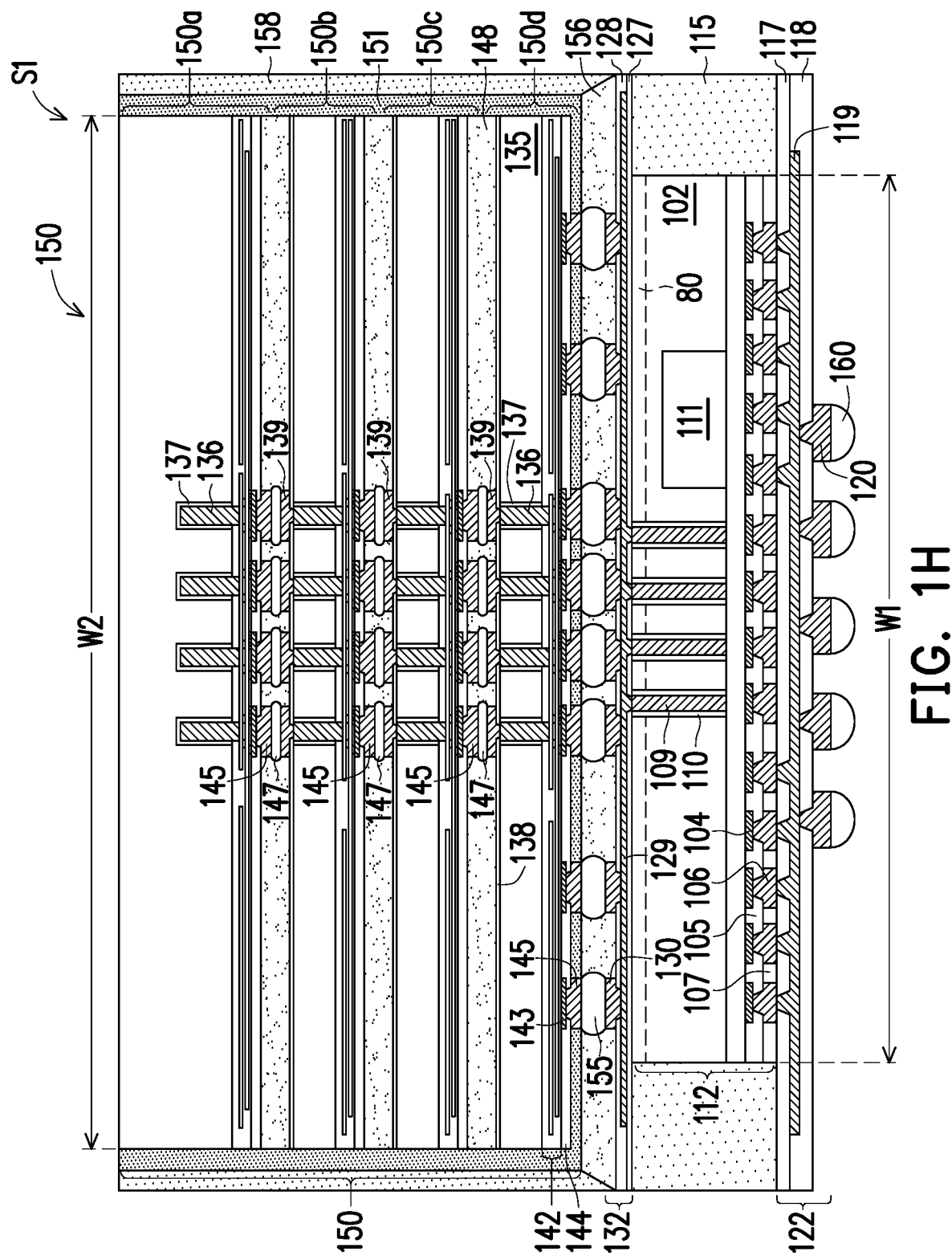

Referring to FIG. 1G and FIG. 1H, in some embodiments, a de-bonding process is performed to release the carrier 100b from the overlying structure. The de-bonding process of the carrier 100b is similar to the de-bonding process of the carrier 100a described above. The adhesive layer 124 may be removed by a cleaning process, for example. As such, the redistribution layer 120 of the RDL structure 122 is exposed for further electrical connection.

Referring to FIG. 1H, a plurality of connectors 160 are formed on and electrically connected to the redistribution layer 120 of the RDL structure 122. The connectors 160 may also be referred to as conductive terminals. The connectors 160 may be solder balls, controlled collapse chip connection (C4) bumps, ball grid array (BGA) connectors, or combinations thereof. In some embodiments, the material of the connector 160 includes copper, aluminum, lead-free alloys (e.g., gold, tin, silver, aluminum, or copper alloys) or lead alloys (e.g., lead-tin alloys). The connector 160 may be formed by a suitable process such as evaporation, plating, ball dropping, screen printing and reflow process, a ball mounting process or a C4 process.

In some embodiments, a singulation process may then be performed to form a plurality of singulated semiconductor structures S1, and each singulated semiconductor structure S1 is shown in FIG. 1H. The semiconductor structure S1 is a package structure, which is a 3DIC package including fan-out RDL structures. The formation of the semiconductor structure S1 includes 3DIC packaging process and integrated fan-out (InFO) packaging process.

Referring to FIG. 1H, in some embodiments, the semiconductor structure S1 includes the die 112, the encapsulant 115, the RDL structures 122 and 132, the die stack structure 150, the underfill layer 156, the encapsulant 158 and the connectors 160. In some embodiments, the die 112 is a logic die configured to perform read, program, erase, and/or other operations, and the die stack structure 150 is a memory stack including memory dies stacked upon one another and programmed by the die 112. In some embodiments, the die 112 and the dies 150a-150d of the die stack structure 150 may be formed under the same or different semiconductor fabrication technology generation(s)/node(s). The die 112 may be a low-power consuming logic die formed by advanced semiconductor fabrication technology node. In an embodiment, the die 112 may be formed under a more advanced fabrication technology generation than the dies 150a-150d. The dies 150-150d of the die stack structure 150 may have same width W2. The width W1 of the die 112 may be the same as or different from the width W2 of the dies 150a-150d of the die stack structure 150. In the illustrated embodiments, the width W1 of the die 112 is less than the width W2 of the dies 150a-150d of the die stack structure 150. In other words, the sidewalls of the die stack structure 150 or the sidewalls of the dies 150a-150d of the die stack structure 150 may laterally extend beyond sidewalls of the die 112. However the disclosure is not limited thereto. In alternative embodiments, the width W1 of the die 112 may be larger than the width W2 of the dies 150a-150d of the die stack structure 150.

The sidewalls of the die 112 are encapsulated by the encapsulant 115. The RDL structures 122 and 132 are disposed on opposite sides of the die 112 and electrically connected to the die 112. The die stack structure 150 is electrically bonded to the RDL structure 132 through the connectors 155, and further electrically connected to the die 112 through the RDL structure 132. The die stack structure 150 is laterally encapsulated by the encapsulant 158. In some embodiments, the die stack structure 150 includes the encapsulant 151 encapsulating the dies 150a-150d, and there is an interface between the encapsulant 151 and the encapsulant 158. The sidewalls of the encapsulant 158, the sidewalls of the RDL structure 132, the sidewalls of the encapsulant 115 and the sidewalls of the RDL structure 122 may be substantially aligned with each other.

In the embodiments of the disclosure, since the fan-out RDL structure 122 is formed on the die 112, the size of the die 112 and/or the size of the die stack structure 150 may be more flexible.

Many variations and/or modifications may be made to the embodiments of the disclosure. FIG. 2A to FIG. 2H are cross-sectional views illustrating semiconductor structures according to some other embodiments of the disclosure. The semiconductor structures are similar to the semiconductor structure S1 except for some variations and/or modifications, and the differences are described in detail below. It is noted that, the optional isolation layer 80 of the semiconductor structure is not specifically shown in each of the following figures for the sake of brevity, and it should be understood that the above-described isolation layer 80 may also be applied in the following semiconductor structures or dies.

Figure 2A:
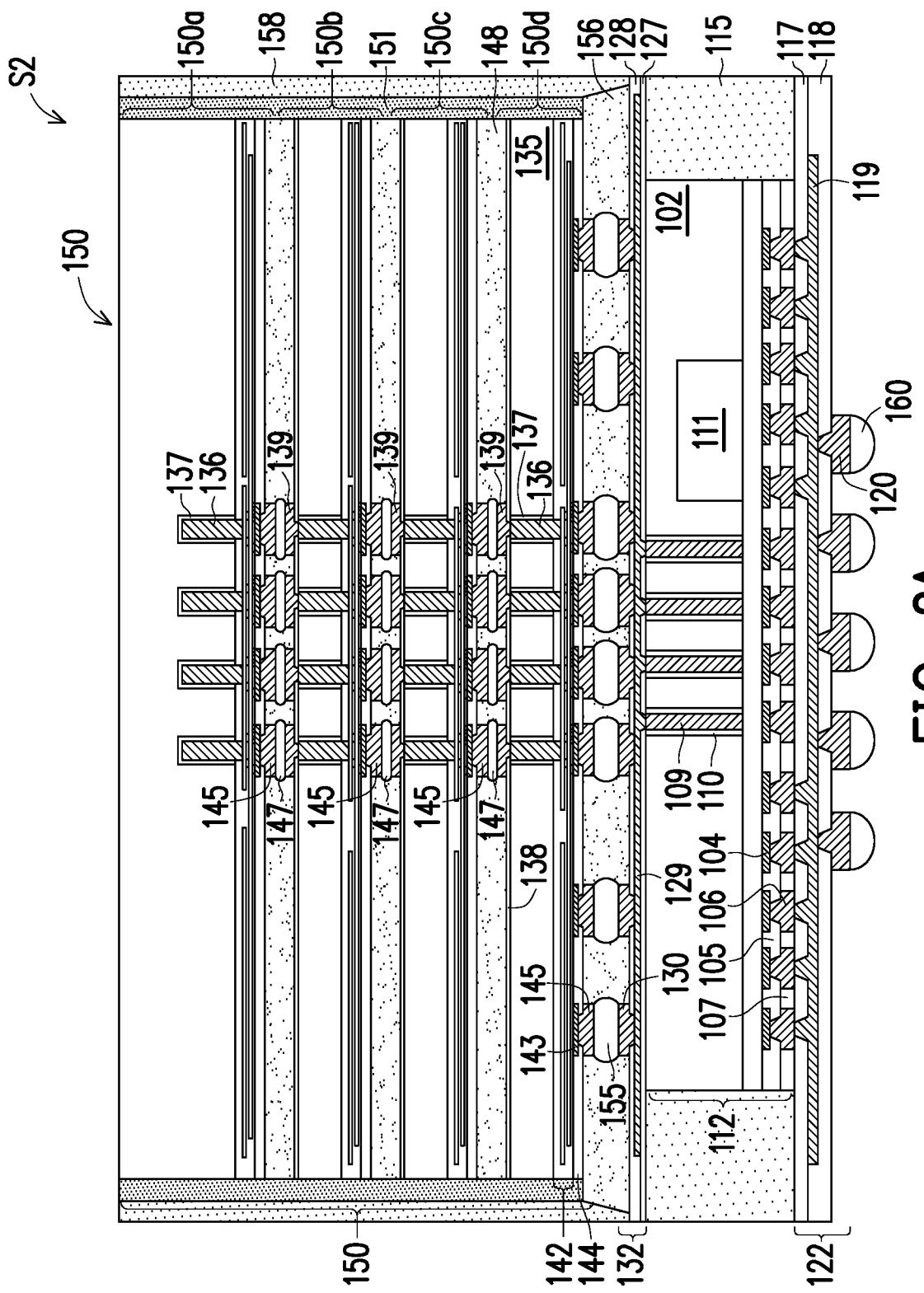
FIG. 2A to FIG. 2H are schematic cross-sectional views illustrating semiconductor structures according to some other embodiments of the disclosure.

Referring to FIG. 2A, a semiconductor structure S2 is illustrated. In some embodiments, the encapsulant 151 of the die stack structure 150 may laterally encapsulate the dies 150a-150d without covering the bottom surface of the die 150d, and the underfill layer 156 further laterally surrounds the connectors 145 of the die 150a and covers the bottom surface of the die 150a. FIG. 2A also illustrates the embodiment in which the encapsulant 158 is in contact with the polymer layer 128 of the RDL structure 132. Other structure features of the semiconductor structure S2 are substantially the same as those of the semiconductor structure S1, which are not described again here. In alternative embodiments, the die stack structure 150 may be free of the encapsulant 151, and the encapsulant 158 is formed to laterally encapsulate and contact sidewalls of the dies 150a-150d of the die stack structure 150.

Figure 2B:
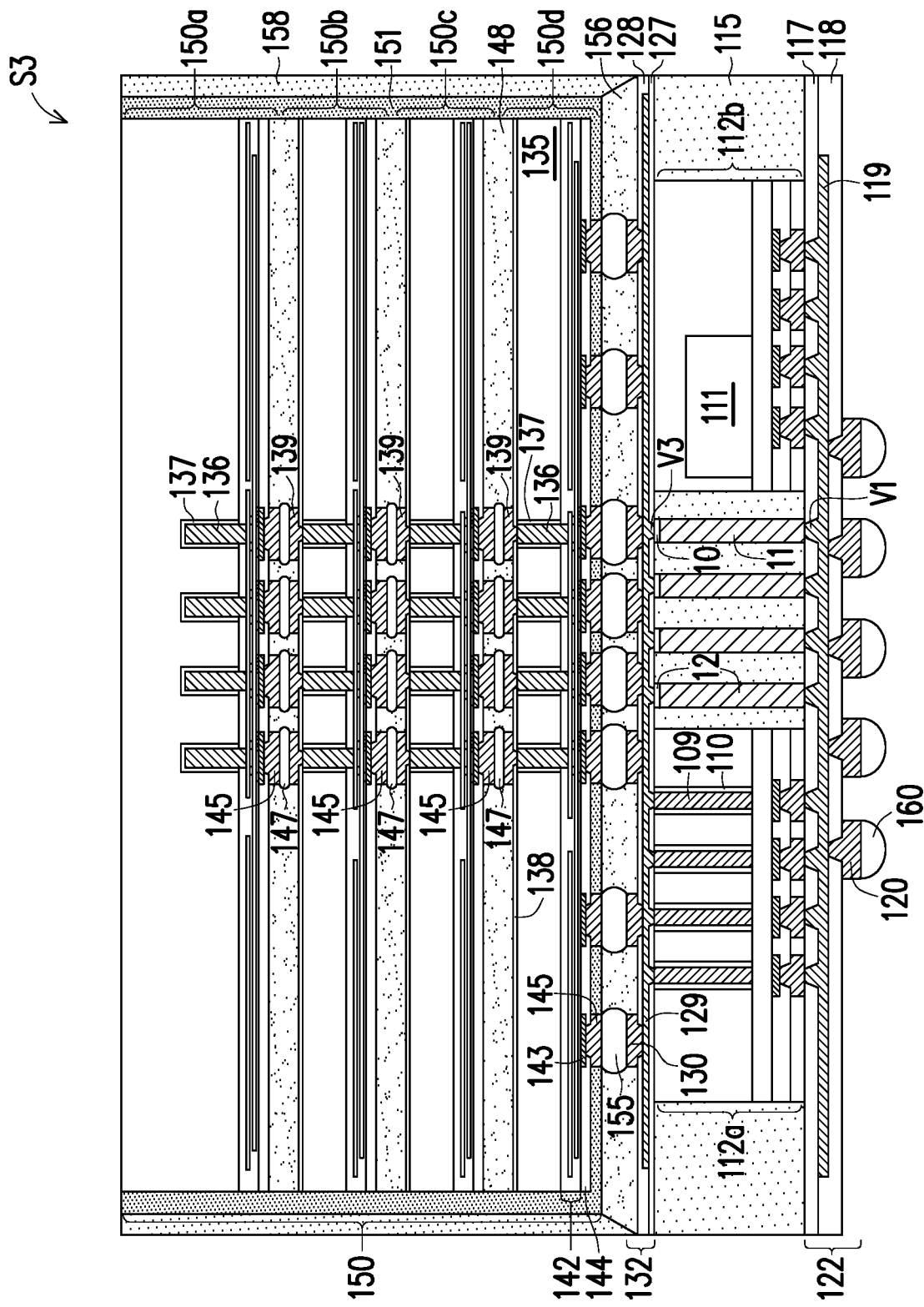

Referring to FIG. 1H and FIG. 2B, in some embodiments, in a semiconductor structure S3, more than one dies may be configured to electrically couple to the die stack structure 150. In addition, conductive vias may be disposed laterally aside the dies and embedded in the encapsulant 115 to provide the electrical connections between the RDL structures 132, 122 and the die(s), and TSVs may be optionally formed in substrate(s) of the die(s).

Referring to FIG. 1A and FIG. 2B, in some embodiments, in the step of FIG. 1A, two dies 112a and 112b are attached to the carrier 100a, and a plurality of conductive vias 12 may be formed on the carrier 100a before attaching the two dies 112a and 112b, the conductive vias 12 are configured as laterally aside the dies 112a and 112b. In some embodiments, the conductive vias 12 may also be referred to as through interlayer via or through integrated fan-out via (TIV). Thereafter, the encapsulant 115 is formed to laterally encapsulate the dies 112a and 112b and the TIVs 12. The RDL structures 122 and 132 are formed to be connected to the TIVs 12. Some of the vias V1 of the redistribution layer 119 of the RDL structure 122 are formed to land on the TIVs 12, and some of the vias V3 of the redistribution layer 129 of the RDL structure 132 are formed to land on the TIVs 12. In some embodiments, the TIVs 12 are formed before forming the RDL structures 122 and 132. The other forming processes of the semiconductor structure S3 are substantially the same as those of the semiconductor structure S1.

As shown in FIG. 2B, in some embodiments, the semiconductor structure S3 includes two dies 112a and 112b electrically coupled to the die stack structure 150. The dies 112a and 112b may be the same types of dies or different types of dies and may have the same sizes (e.g. width) or different sizes. In some embodiments, each of the dies 112a and 112b may have a structure similar to the die 112, and may be the similar type of the die 112, such as a logic die. Each of the dies 112 and 112b may have a width smaller than the width of the dies of the die stack structure 150.

The dies 112a and 112b are laterally encapsulated by the encapsulant 115. TIVs 12 may be disposed aside the dies 112a and 112b and laterally encapsulated by the encapsulant 115. The TIVs 12 include conductive materials such as copper, nickel, solder, alloys thereof, or the like, or a combination thereof. In some embodiments, the TIV 12 includes a seed layer 10 and a conductive post 11 formed thereon. The seed layer 10 may be a metal seed layer such as a copper seed layer. In some embodiments, the seed layer 10 includes a first metal layer such as a titanium layer and a second metal layer such as a copper layer over the first metal layer. The conductive post 11 may include copper or other suitable metals. In some embodiments, some of the vias V1 of the RDL structure 122 land on the conductive posts 11 of the TIVs 12, while some of the vias V3 of the RDL structure 132 land on the seed layer 10 of the TIVs 12.

In some embodiments, each of the dies 112a and 112b may optionally include the TSVs 109. For example, the die 112a includes the TSVs 109 while the die 112b is free of the TSVs. The dies 112a and 112b are electrically connected to each other through the RDL structure 122, the RDL structure 132 is electrically connected to the die 112a through the TSVs 109 and/or through the TIVs 12 and the RDL structure 122, the RDL structure 132 is electrically connected to the die 112b through the TIVs 12 and the RDL structure 122. In alternative embodiments, both of the dies 112a and 112b may be free of TSV, and the RDL structure 132 is electrically connected to the dies 112a and 112b through the TIVs 12 and the RDL structure 122.

Figure 2C:
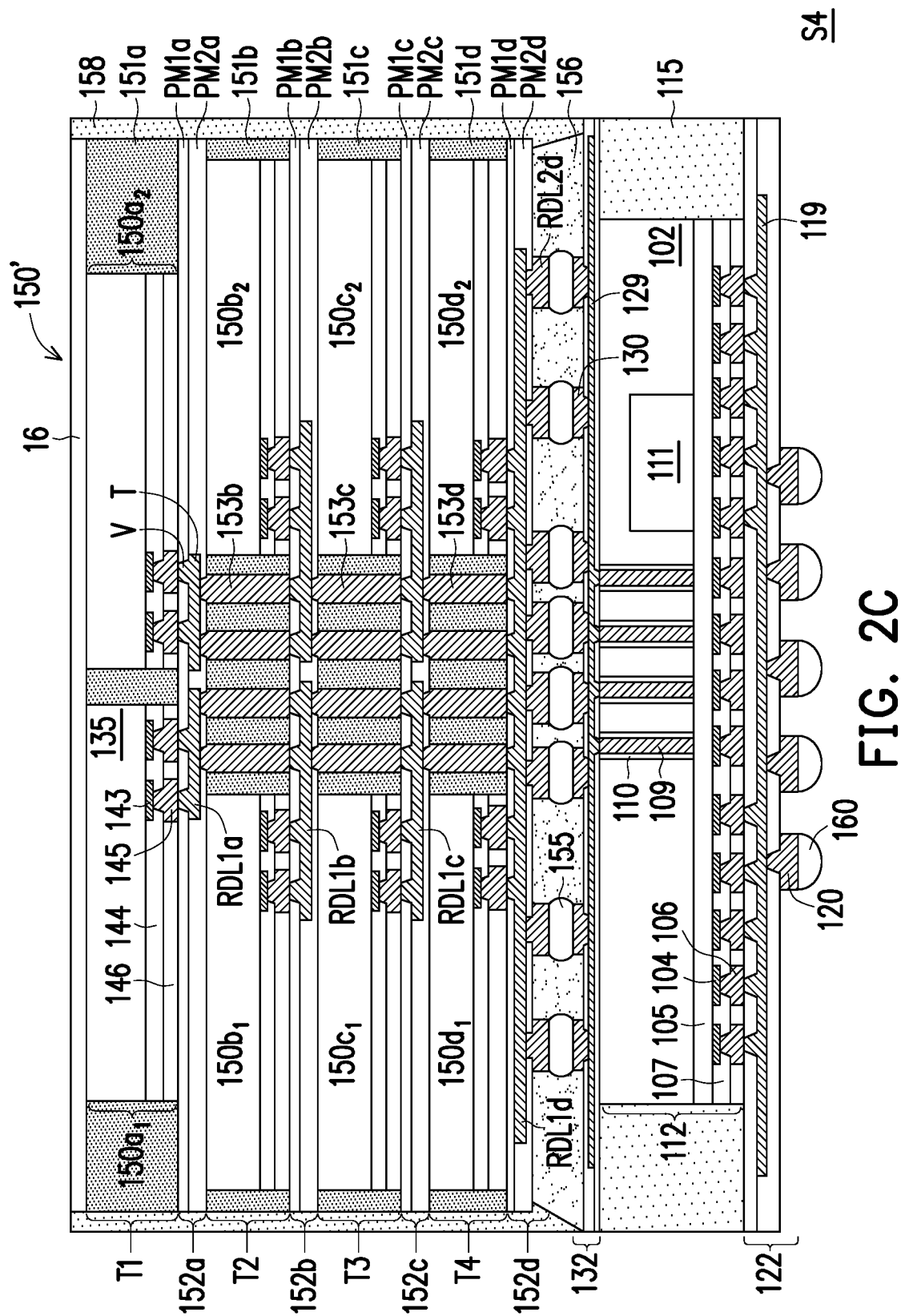

FIG. 2C illustrates a semiconductor structure S4 which is similar to the semiconductor structure S1, except that the die stack structure 150 is replaced by a die stack structure 150', and the die stack structure 150' of FIG. 2C illustrates another electrical connection method of the dies. Referring to FIG. 2C, in some embodiments, the die stack structure 150' includes a plurality tiers of dies stacked upon one another and electrically connected to each other through RDL structures. Each tier of the die stack structure 150' may include at least one die. It is noted that, the number of dies in each tier of the die stack structure and the number of tiers of the die stack structure shown in FIG. 2C are merely for illustration, and the disclosure is not limited thereto.

For example, the die stack structure 150' includes the dies $150a_1$, $150a_2$, $150b_1$, $150b_2$, $150c_1$, $150c_2$, $150d_1$, $150d_2$, the encapsulant 151a, 151b, 151c, 151d, the RDL structures 152a, 152b, 152c, 152d and the TIVs 153b, 153c, 153d. Each of the dies $150a_1$, $150a_2$, $150b_1$, $150b_2$, $150c_1$, $150c_2$, $150d_1$, $150d_2$ may be a die of a similar type to the dies 150a-150d, and have a structure similar to that of the dies 150a-150d. The materials of the encapsulant 151a-151d are substantially the same as those of the above-described encapsulant 151.

In some embodiments, each of the dies $150a_1$-$150d_2$ includes a substrate 135, a plurality of devices, an interconnection structure, a plurality of pads 143, a passivation layer 144, and a plurality of connectors 145. For the sake of brevity, the interconnection structure is not specifically shown in FIG. 2C. In some embodiments, each of the dies $150a_1$-$150d_2$ may further include a passivation layer 146 on the passivation layer 144 and laterally surrounding the connectors 145. The passivation layer 146 may include a polymer material such as PI, PBO, BCB, the like or combinations thereof. In some embodiments, the dies $150a_1$-$150d_2$ are free of TSVs.

In some embodiments, the die stack structure 150' includes four tiers of dies, and each tier includes two dies laterally encapsulated by an encapsulant. For example, the dies $150a_1$ and $150a_2$ and the encapsulant 151a are at the first tier T1 of the die stack structure 150', the encapsulant 151a laterally encapsulate sidewalls of the dies $150a_1$ and $150a_2$. The bottom surface and the top surface of the encapsulant 151a may be substantially coplanar with the bottom surfaces (e.g. active or front surfaces) and the top surfaces of the dies $150a_1$ and $150a_2$, respectively. In some embodiments, there is free of TIVs at the first tier T1 of the die stack structure 150', that is, there may be free of TIVs laterally aside the dies $150a_1$ and $150a_2$ and embedded in the encapsulant 151a.

The dies $150b_1$ and $150b_2$, the encapsulant 151b and the TIVs 153b are at the second tier T2 of the die stack structure 150'. The TIVs 153b are laterally aside the dies $150b_1$ and $150b_2$. The encapsulant 151b laterally encapsulates sidewalls of the dies $150b_1$ and $150b_2$ and sidewalls of the TIVs 153b. In some embodiments, the bottom surfaces of (e.g. active or front surfaces) the dies $150b1$ and $150b_2$, the bottom surfaces of the TIVs 153b and the bottom surface of the encapsulant 151b are substantially coplanar with each other.

The dies $150c_1$ and $150c_2$, the encapsulant 151c and the TIVs 153c are at the third tier T3 of the die stack structure 150'. The TIVs 153c are laterally aside the dies $150c_1$ and $150c_2$. The encapsulant 151c laterally encapsulates sidewalls of the dies $150c_1$ and $150c_2$ and sidewalls of the TIVs 153c. In some embodiments, the bottom surfaces of the dies $150c_1$ and $150c_2$, the TIVs 153c and the encapsulant 151c are substantially coplanar with each other.

The dies $150d_1$ and $150d_2$, the encapsulant 151d and the TIVs 153d are at the fourth tier T4 of the die stack structure 150'. The TIVs 153d are laterally aside the dies $150d_1$ and $150d_2$. The encapsulant 151d laterally encapsulates sidewalls of the dies $150d_1$ and $150d_2$ and sidewalls of the TIVs 153d. In some embodiments, the bottom surfaces of the dies $150d_1$ and $150d_2$, the bottom surfaces of the TIVs 153d and the bottom surface of the encapsulant 151d are substantially coplanar with each other.

In some embodiments, a plurality of RDL structures are disposed between adjacent two tiers of the die stack structure 150' to provide electrical connection therebetween. For example, the RDL structure 152a is disposed between the first and second tiers T1 and T2 of the die stack structure 150'. The RDL structure 152a may include polymer layers PM1a, PM2a and a redistribution layer RDL1a. The numbers of the layers of the polymer layers and redistribution layer included in the RDL structure 152a shown in FIG. 2C is merely for illustration, and the disclosure is not limited thereto. The materials of the polymer layers and redistribution layer of the RDL structure 152a are similar to those of the RDL structure 122, 132, which are not described again here.

The redistribution layer RDL1a penetrates through the polymer layer PM1a to be in physical and electrical contact with the connectors 145 of the dies $150a_1$ and $150a_2$. The redistribution layer RDL1a includes a plurality of vias V and traces T electrically connected to each other. The vias V are embedded in the polymer layer PM1a and landing on the connectors 145. The traces T are extending on the polymer layer PM1a and electrically connected to the connectors 145 of the dies $150a_1$ and $150a_2$ through the vias V. In some embodiments, the traces T are interconnected to each other, such that the dies $150a_1$ and $150a_2$ are electrically connected to each other through the redistribution layer RDL1a. In alternative embodiments, the traces T include two sections electrically isolated from each other and respectively connected to the die $150a_1$ and the die $150a_2$. In such embodiments, the redistribution layer (e.g. RDL1a) provide the electrical connection for adjacent dies (e.g. $150a_1$ and $150b_1$) in vertical direction, without providing the electrical connection between adjacent dies (e.g. $150a_1$ and $150a_2$) in horizontal direction. The sidewalls of the vias V may be straight or inclined. In some embodiments, the vias V have inclined sidewalls and may be tapered toward the dies $150a_1$ and $150a_2$ at the first tier T1 and may be tapered away from the die 112. In some embodiments, the TIVs 153b at the second tier T2 of the die stack structure 150' penetrates through the polymer layer PM2a to be in physical and electrical contact with the redistribution layer RDL1a of the RDL structure 152a and further electrically connected to the dies $150a_1$ and $150a_2$ at the first tier T1.

The RDL structure 152b is disposed between the second tier T2 and third tier T3 of the die stack structure 150'. The RDL structure 152c is disposed between the third tier T3 and the fourth tier T4 of the die stack structure 150'. The structural features of the RDL structure 152b and 152c are similar to those of the RDL structure 152a, expect the vias of the RDL structures 152b and 152c further lands on TIVs. For example, the RDL structure 152b includes polymer layers PM1b, PM2b and a redistribution layer RDL1b. The redistribution layer RDL1b penetrates through the polymer layer PM1b to be in physical and electrical contact with the connectors 154 of the dies $150b_1$ and $150b_2$ and the TIVs 153b at the second tier T2. The TIVs 153c at the third tier T3 penetrates through the polymer layer PM2b to be in physical and electrical contact with the redistribution layer RDL1b.

The RDL structure 152c includes polymer layers PM1c, PM2c and a redistribution layer RDL1c. The redistribution layer RDL1c penetrates through the polymer layer PM1c to be in physical and electrical contact with the connectors 154 of the dies $150c_1$ and $150c_2$ and the TIVs 153c at the third tier T3. The TIV 153d at the fourth tier T4 penetrates through the polymer layer PM2c to be in physical and electrical contact with the redistribution layer RDL1c.

The RDL structure 152d is disposed on the topmost tier (such as fourth tiers T4) of the die stack structure 150'. In some embodiments, the RDL structure 152d includes polymer layers PM1d, PM2d and redistribution layers RDL1d and RDL2d. The redistribution layers RDL1d penetrates through the polymer layer PM1d to be in physical and electrical contact with the dies $150d_1$ and $150d_2$ and the TIVs 153d. The redistribution layers RDL2d penetrates through the polymer layer PM2d to be in physical and electrical contact with the redistribution layer RDL1d. In some embodiments, the redistribution layers RDL2d are conductive bumps serving as external connection of the die stack structure 150'.

In some embodiments, the dies $150a_1$-$150d_2$ of the die stack structure 150' are electrically connected to each other through the RDL structures 152a-150d and the TIVs 153b-153c. However, the disclosure is not limited thereto. In some other embodiments, the die stack structure 150' may be divided into two die stacks which are electrically isolated from each other. For example, the dies $150a_1$, $150b_1$, $150c_1$ and $150d_1$ may be referred to as a first die stack (or left die stack) of the die stack structure 150'; and the dies $150a_2$, $150b_2$, $150c_2$ and $150d_2$ may be referred to as a second die stack (or right die stack) of the die stack structure 150'. The redistribution layers RDL1a, RDL1b, RDL1c and RDL1d may respectively include two separate sections (e.g. first sections and second sections) electrically isolated from each other and respectively provide the electrical connection for the left or right die stack of the die stack structure 150'. For example, the dies $150a_1$, $150b_1$, $150c_1$ and $150d_1$ of the left die stack are electrically connected to each other through first sections of the redistribution layers RDL1a, RDL1b, RDL1c and RDL1d and some of the TIVs 153b-153d, while the dies $150a_2$, $150b_2$, $150c_2$ and $150d_2$ of the right die stack are electrically connected to each other through second sections of the redistribution layers RDL1a, RDL1b, RDL1c and RDL1d and some of the TIVs 153b-153d. As such, the left die stack $150a_1$, $150b_1$, $150c_1$ and $150d_1$ are electrically isolated form the right die stack $150a_2$, $150b_2$, $150c_2$ and $150d_2$ in the die stack structure 150'. In some embodiments, the left die stack and the right die stack may have different functions. In some embodiments, the left die stack and the right die stack of the die stack structure 150' are respectively coupled to the die 112 through the connectors 155 and the RDL structure 132. In alternative embodiments, the left die stack and the right die stack may be coupled to each other through the RDL structure 132 and integrated with the die 112. In some embodiments, the sidewalls of the RDL structures 152a-152d and the sidewalls of the encapsulants 151a-151d are substantially coplanar with each other.

In some embodiments, the die stack structure 150' may optionally include an additional layer 16 on the dies $150a_1$ and $150a_2$ and the encapsulant 151a at a side opposite the RDL structure 152a. The additional layer 16 may be an adhesive layer such as DAF or other suitable adhesives. Alternatively or additionally, the additional layer 16 may include a polymer layer or a dielectric layer. In alternative embodiments, the die stack structure 150' may be free of the additional layer 16. For example, in order to adjust the height of the die stack structure 150', the additional layer 16 and/or a portion of the encapsulant 158 laterally aside the additional layer 16 may be removed to expose the dies $150a_1$ and $150a_2$ by a planarization process such as a grinding process or a CMP process. Alternatively or additionally, the substrates 135 of the dies $150a_1$ and $150a_2$ may further be thinned by the planarization process to adjust the height of the die stack structure 150'. In such embodiments, the top surfaces of the dies $150a_1$ and $150a_2$, the top surface of the encapsulant 151a and the top surface of the encapsulant 158 may be substantially coplanar with each other.

In some embodiments, the forming method of the die stack structure 150' may include the following processes. A temporary carrier (not shown) is provided, a polymer layer or a dielectric layer may be optionally formed on the temporary carrier, the dies $150a_1$ and $150a_2$ are attached to the carrier through an adhesive layer, such as the additional layer 16. The encapsulant 151a is formed laterally aside the dies $150a_1$ and $150a_2$ through an over-molding process and a planarization process. Thereafter, the RDL structure 152a is formed on the dies $150a_1$ and $150a_2$ and the encapsulant 151a. Afterwards, the TIVs 153b is formed on and electrically connected to the RDL structure 152a, the dies $150b_1$ and $150b_2$ are attached to the RDL structure 152a through adhesive layers (not shown), for example. The encapsulant 151b is formed to laterally encapsulate the dies $150b_1$ and $150b_2$ and the TIVs 153b through an over-molding process and a planarization process. The RDL structure 152b is then formed on and electrically connected to the dies $150b_1$ and $150b_2$ and the TIVs 153b. Therefore, processes of forming TIVs, attaching dies, forming encapsulant and forming RDL structure similar to those described above are repeated, so as to form the third tier T3, the RDL structure 152c, the fourth tier T4 and the RDL structure 152d of the die stack structure 150'. Afterwards, the temporary carrier is released, the additional layer 16 may be optionally remained, and a singulation process may be performed to form the singulated die stack structure 150'. In some embodiments, the surface of the RDL structure 152d may be referred to as front surface of the die stack structure 150', and the surface of the additional layer 16 may be referred to as back surface of the die stack structure 150'.

Still referring to FIG. 2C, in some embodiments, the die stack structure 150' is mounted to the die 112 in a flip chip manner. That is, the front surfaces of the die stack structure 150' faces down toward the RDL structure 132, and the redistribution layer RDL2d of the RDL structure 152d are electrically connected to the RDL structure 132 through the connectors 155. The underfill layer 156 fills the space between the die stack structure 150' and the RDL structure 132 to laterally surround the redistribution layers RDL2d, the connectors 155 and the redistribution layers 130 of the RDL structure 132. The encapsulant 158 laterally encapsulates sidewalls of the encapsulants 151a-151d and the RDL structures 152a-152d of the die stack structure 150'. Interfaces are existed between the encapsulant 158 and the encapsulants 151a-151d.

In some embodiments in which the die stack structure 150' includes the additional layer 16, the top surface of the encapsulant 158 is substantially coplanar with the top surface of the additional layer 16. In alternative embodiments in which the die stack structure 150' does not include the additional layer 16, the top surface of the encapsulant 158 may be substantially coplanar with the top surfaces of the encapsulant 151a and the dies $150a_1$ and $150a_2$.

In some embodiments, among aforementioned die stack structures 150 and 150', one or more of the dies included therein may be or replaced by passive device(s) such as integrated passive device (IPD), capacitors or any other suitable semiconductor devices. In the embodiments in which one or more die of the die stack structure 150/150' is passive device, the said one or more die is free of active device therein. For example, in the die stack structure 150, one or more of the dies 150a-150d may be or replaced by a passive device such as IPD(s), capacitor(s), or the like, or combinations thereof, and other dies are active dies such as memory dies. In the die stack structure 150', one or more of the dies $150a_1$-$150d_2$ may be or replaced by IPD(s) or capacitor(s), or the like, and other dies are active dies such as memory dies. The passive device die(s) such as IPD(s) may have a size the same as or different than the active dies.

Figure 2D:
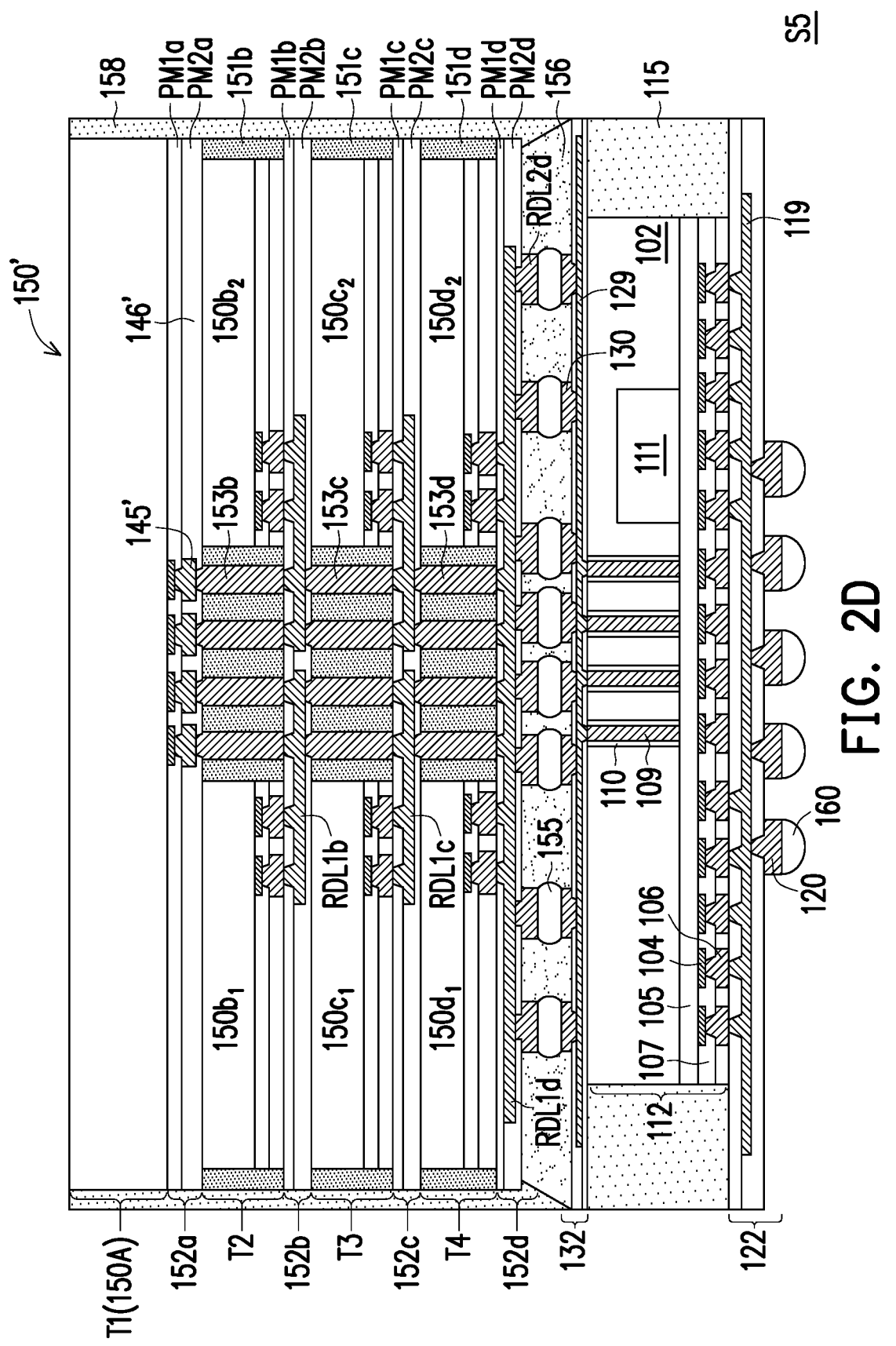

FIG. 2D illustrates an example in which the die stack structure includes an IPD according to some other embodiments of the disclosure. For example, FIG. 2D illustrates a semiconductor structure S5 which is similar to the semiconductor structure S4 in FIG. 2C, except that the dies 150$a_1$ and 150$a_2$ at the first tier T1 are replaced by an IPD 150A. In some embodiments, the IPD 150A includes a plurality of conductive connectors 145' severing for external connection. The conductive connectors 145' may include copper, or other suitable metallic material. A passivation layer 146' is formed to cover the conductive connectors 145'. The passivation layer 146' may include silicon oxide, silicon nitride, a polymer material such as PI, PBO, BCB or the like, or combinations thereof.

In some embodiments, the IPD 150A has a larger size than the other dies of the die stack structure 150'. In some embodiments, there may be free of encapsulant at the first tier T1, and there may be free of RDL structure between the IPD 150A and the dies at the second tier T2. For example, the TIVs 153*b* at the second tier T2 penetrates through the passivation layer 146' to be in physical and electrical contact with the conductive connectors 145' of the IPD 150A. In some embodiments, the sidewalls of the IPD 150A is substantially aligned with the sidewalls of the encapsulants 151*b*, 151*c*, 151*d* and laterally encapsulated by and contact the encapsulant 158. However, the disclosure is not limited thereto.

In the above-described embodiments, the semiconductor structure S1-S5 includes one die stack structure coupled to one or more dies, but the disclosure is not limited thereto. The number of the die stack structure and the number of the die electrically connected to the die stack structure are not limited in the disclosure.

Figure 2E:
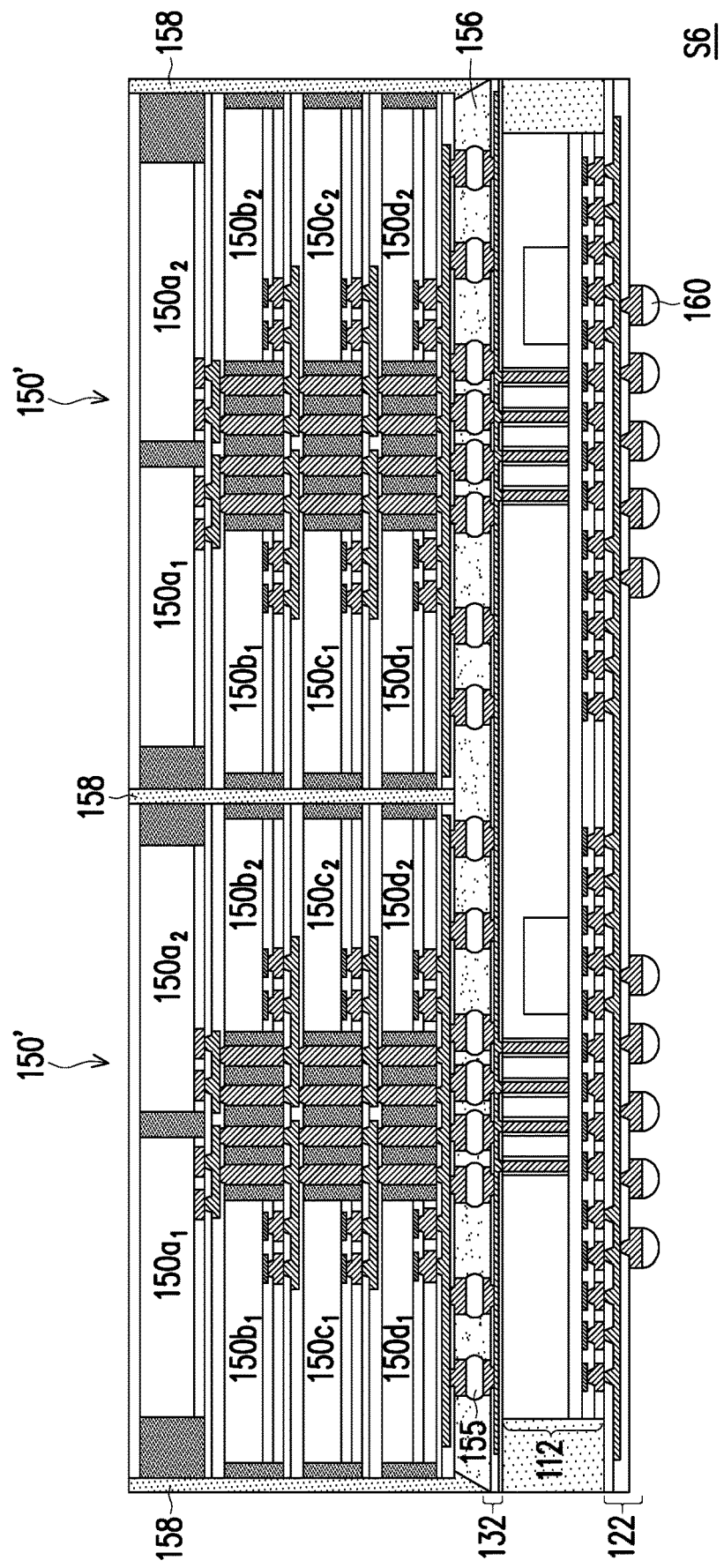
Figure 2F:
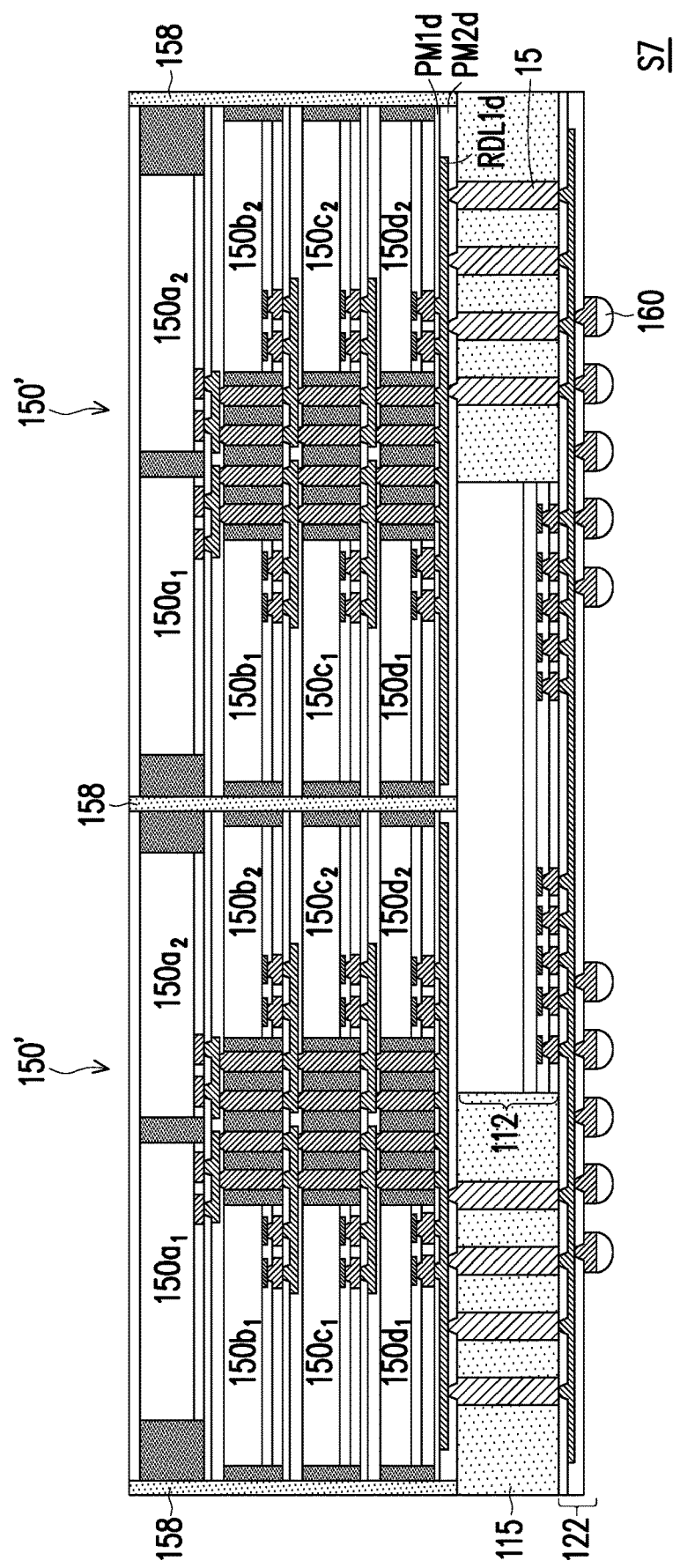
Figure 2G:
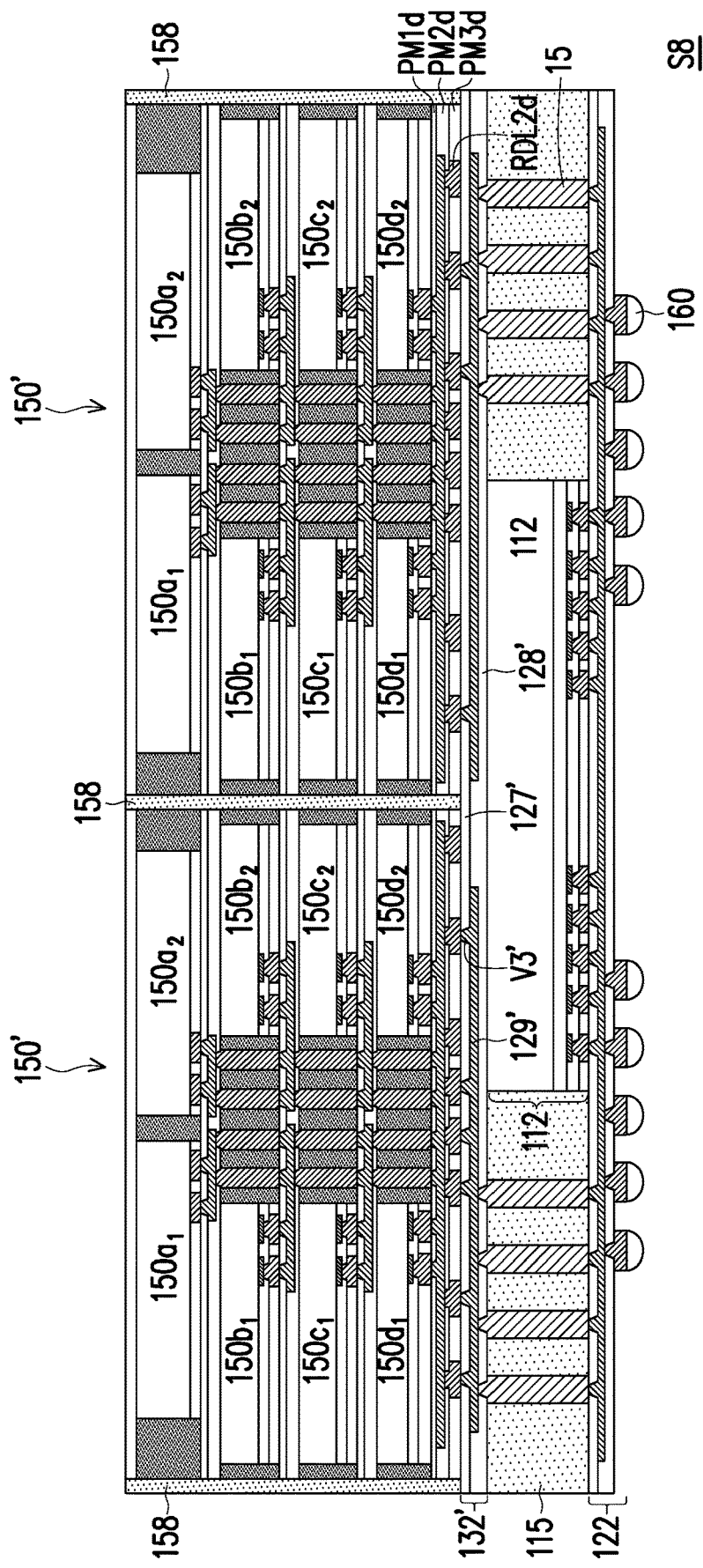

FIG. 2E and FIG. 2G illustrates some semiconductor structures according to some other embodiments of the disclosure, in which more than one die stack structure are included in the semiconductor structure.

Referring to FIG. 2E, in some embodiments, a semiconductor structure S6 includes two die stack structures 150' electrically connected to the die 112. The die stack structures 150' may be disposed side by side and encapsulated by the encapsulant 158. The two die stack structures 150' are electrically connected to the RDL structure 132 through the connectors 155, and further electrically coupled to the die 112 through the RDL structure 132.

In the foregoing embodiments, the die stack structures 150/150' are bonded to the RDL structure 132 over the die 112 through the connectors 155 after the RDL structures 132 and 122 have been formed on opposite sides of the die 112, and the encapsulant 158 is formed after bonding the die stack structure(s) 150/150' to the die 112. However, the disclosure is not limited thereto. FIG. 2F and FIG. 2G illustrates some other electrical connection method of the die stack structure 150/150' and the die 112 according to some other embodiments of the disclosure. For the sake of brevity, the details are described below taken the die stack structure 150' as an example.

Referring to FIG. 2F, in some embodiments, a semiconductor structure S7 includes the die 112 electrically connected to two die stack structures 150', and the die 112 is connected to the die stack structures 150' after forming the encapsulant 158 aside the die stack structures 150'. In the present embodiment, the die stack structure 150' is free of the redistribution layer RDL2*d* shown in FIG. 2E, and the redistribution layer RDL1*d* is covered by the polymer layer PM2*d*. For example, after the two die stack structure 150' are formed, the two die stack structure 150' are disposed side by side, and the encapsulant 158 is then formed to laterally encapsulate the die stack structures 150'. Thereafter, the TIVs 15 are formed on and electrically connected to the die stack structures 150'. The TIVs 15 penetrates through the polymer layer PM2*d* to connect to the redistribution layers RDL1*d* of the die stack structures 150'. The die 112 is mounted on the die stack structures 150' and the encapsulant 158. In some embodiments, the die 112 is attached to the die stack structures 150' and the encapsulant 158 through an adhesive layer (not shown). The die 112 is disposed laterally aside the TIVs 15. Afterwards, the encapsulant 115 is formed on the die stack structures 150' and the encapsulant 158 to laterally encapsulate the die 112 and the TIVs 15. The RDL structure 122 is then formed on the die 112, the TIVs 15 and the encapsulant 115, so as to electrically connect to the die 112 and the TIVs 15, and the connectors 160 are formed on and electrically connected to the RDL structure 122.

Referring to FIG. 2G, a semiconductor structure S8 is illustrated, the semiconductor structure S8 is similar to the semiconductor structure S7, except that a RDL structure 132' is further disposed between the die 112 and the die stack structures 150'. In the present embodiments, the die stack structure 150' may include a polymer layer PM3*d* laterally covering sidewalls of the redistribution layer RDL2*d*, and surface of the polymer layer PM3*d* may be substantially coplanar with the surfaces of the redistribution layer RDL2*d*. In some embodiments, after the encapsulant 158 is formed laterally aside the die stack structures 150' to encapsulate sidewalls of the die stack structures 150', the RDL structure 132' is formed on the die stack structures 150' and the encapsulant 158 to electrically connected to the die stack structures 150'. The RDL structure 132' includes one or more redistribution layers and polymer layer(s) stacked alternately, which is similar to the structures of above-described RDL structures. For example, the RDL structure 132' includes polymer layers 127', 128' and redistribution layer 129'. The redistribution layer 129' penetrates through the polymer layer 127' to connect to the die stack structures 150'. The vias V3' of the redistribution layer 129' may be straight or inclined. In some embodiments, the vias V3' have inclined sidewalls and are tapered toward the die stack structures 150'. In other words, the vias V3' may be tapered away from the die 112, which is different from the via V3 of RDL structure 132 in FIG. 2C. Such difference is because of the different process order.

After the RDL structure 132' is formed, the TIVs 15 are formed on and electrically connected to the RDL structure 132', so as to electrically connect to the die stack structures 150' through the RDL structure 132'. The die 112 is then mounted on the RDL structure 132'. For example, the die 112 is attached to the RDL structure 132' through an adhesive layer (not shown). The encapsulant 115 is then formed to laterally encapsulate sidewalls of the die 112 and the TIVs 15. Thereafter, the RDL structure 122 and the connectors 160 are formed to electrically connect to the die 112 and the TIVs 15.

Figure 2H:
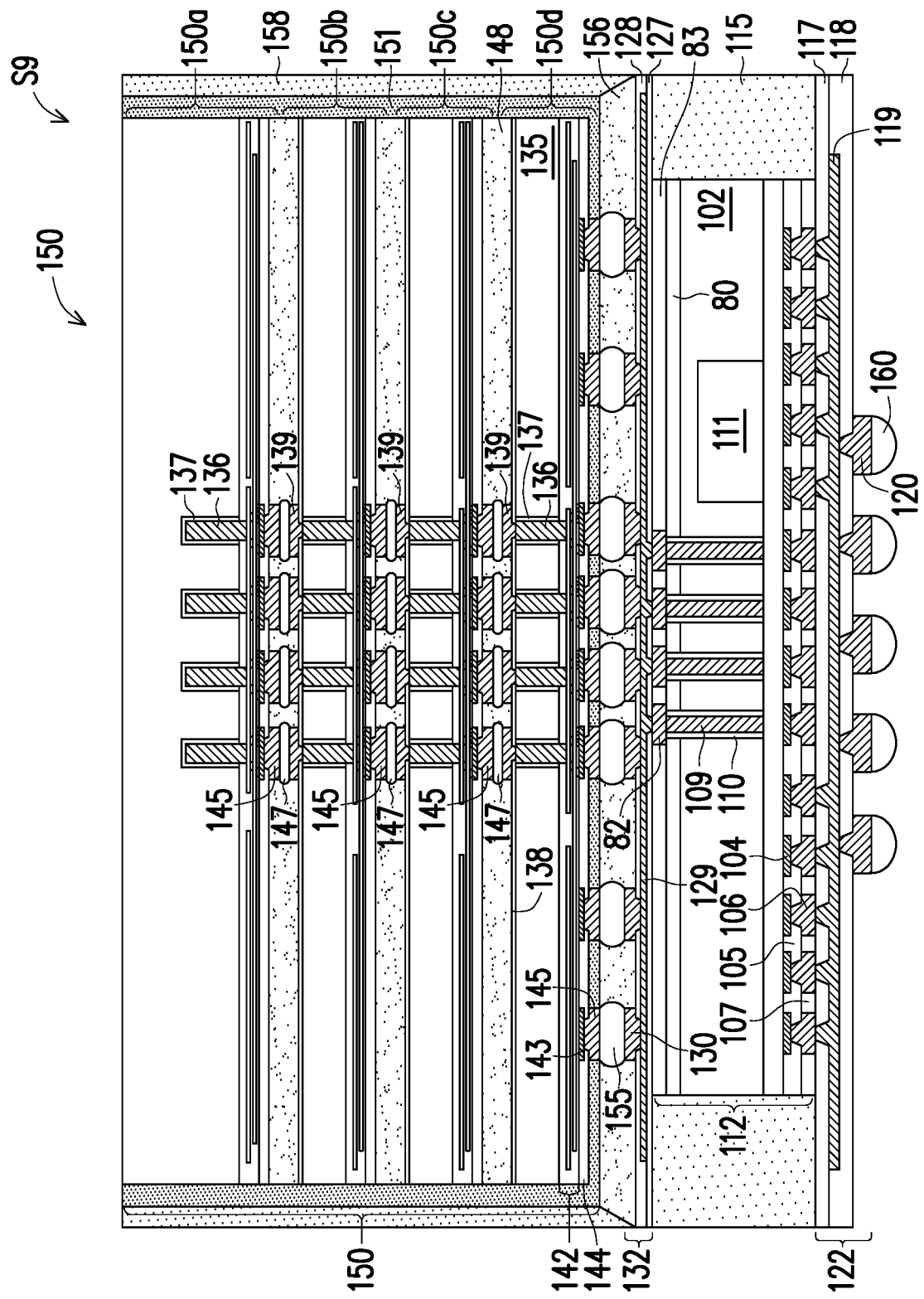

FIG. 2H illustrates a semiconductor structure S9 according to some other embodiment of the disclosure. The semiconductor structure S9 is similar to the semiconductor structure S1 except that the die 112 further includes a dielectric layer 83 and conductive pads 82 at back side. Referring to FIG. 2H, in some embodiments, the conductive pads 82 are disposed on and electrically connected to the TSVs 109, the dielectric layer 83 is disposed over the back surface of the substrate 102 and laterally surrounding the conductive pads 82. The conductive pad 82 may have a dimension larger than the dimension of the corresponding TSV 110, which facilitate the via landing of the redistribution layer 129. In such embodiment, the isolation layer 80 is necessary to prevent the conductive material diffusion from the conductive pads 82 to the substrate 102. In some embodiments, the conductive pad 82 includes a suitable metallic material, such as copper. The dielectric layer 83 may include an organic dielectric material, such as silicon oxide, silicon nitride, silicon oxynitride, or the like, or inorganic dielectric material, such as polymer material (e.g. PI, PBO, BCB, or the like) or combinations thereof.

In some embodiments, the foregoing semiconductor structures S1-S8 may be integrated with other semiconductor components or dies into further package such as integrated fan-out (InFO) package, chip-on-wafer (CoW) package or chip-on-wafer-on-substrate (CoWoS) package or combinations thereof. When integrated with other semiconductor components into further package, the foregoing semiconductor structures may be with or without the connectors 160. The details are described below taken the semiconductor structure S1 as an example.

Figure 3A:
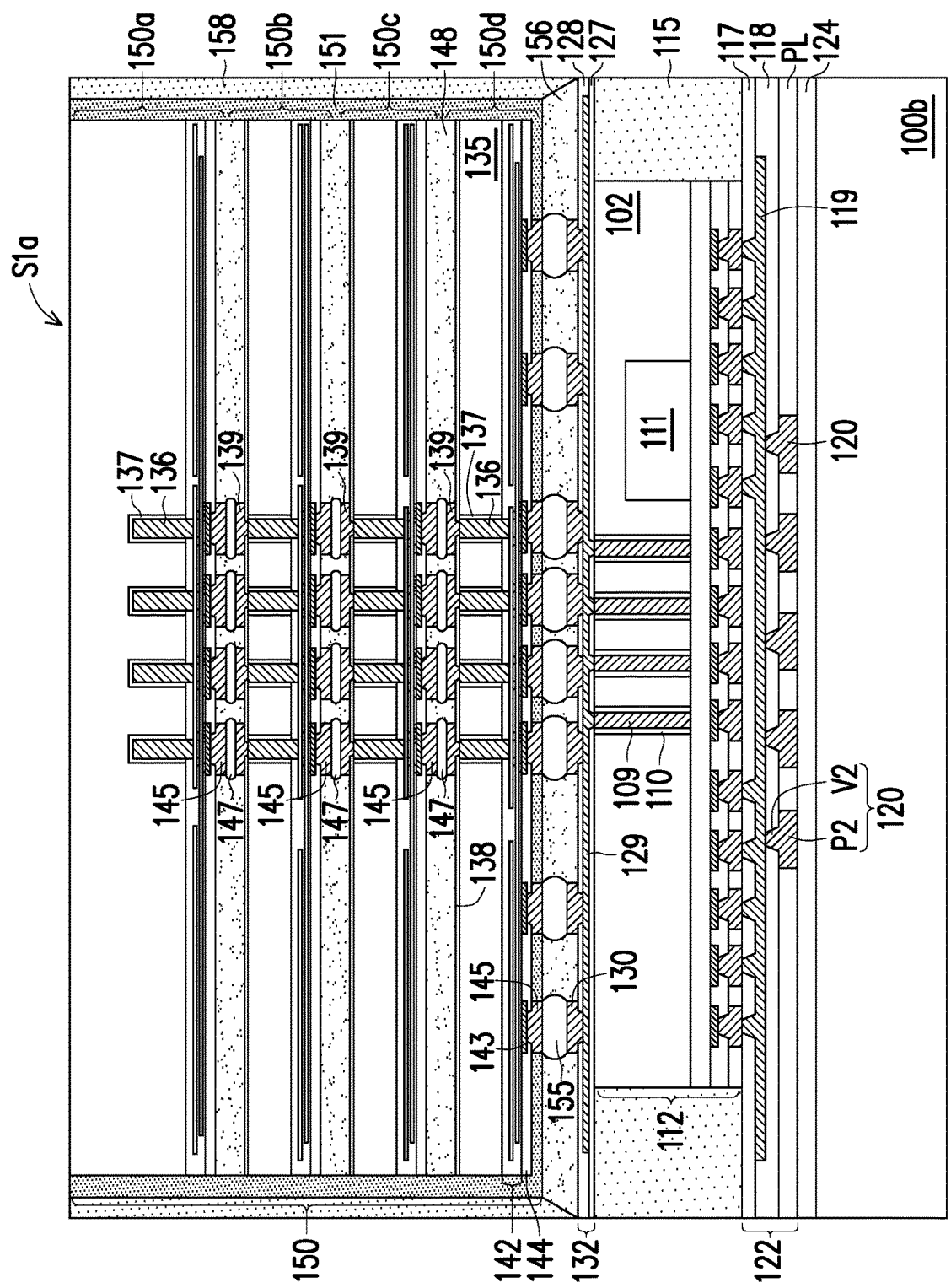
FIG. 3A to FIG. 3E are schematic cross-sectional views illustrating a method of forming a package structure according to some embodiments of the disclosure, wherein the method illustrates some embodiments of further packaging processes performed on the semiconductor structure formed from FIG. 1A to FIG. 2H.

Referring to FIG. 3A, in some embodiments, a semiconductor structure S1a is formed on the carrier 100b, the forming process and structure of the semiconductor structure S1a are similar to those of the semiconductor structure S1, except that the semiconductor structure S1a does not include connectors 160 on the redistribution layer 120, and further include a polymer layer PL laterally covering sidewalls of the redistribution layer 120. The material of the polymer layer PL is similar to the material of the polymer layers 117 and 118 of the RDL structure 122. For example, the polymer layer PL may include a polymer material, such as PI, PBO, BCB, or the like. In some embodiments, the polymer layer PL is formed after the step of FIG. 1B and before the step of FIG. 1B. For example, referring to FIG. 1B and FIG. 1C, after the redistribution layer 120 of the RDL structure 122 is formed in the step of FIG. 1B, a polymer material layer is further formed on the polymer layer 118 to cover top surfaces and sidewalls of the protruding portions P2 of the redistribution layers 120. Thereafter, a planarization process may be performed to remove a portion of the polymer material layer over the top surfaces of the redistribution layers 120, so as to expose the top surfaces of the redistribution layers 120 for further electrical connection. The surface of the polymer layer PL may be substantially coplanar with the surfaces of the redistribution layers 120. Thereafter, processes similar to those described in FIG. 1C to FIG. 1G are performed to form the semiconductor structure S1a shown in FIG. 3A, the step of FIG. 1H for forming the connectors 160 is omitted. In some other embodiments, both of the redistribution layer 120 and the polymer layer PL may be omitted, and the polymer layer 118 is attached to the carrier 100b through the adhesive layer 124. In such embodiment, the redistribution layer 119 is covered by the polymer layer 118 without being exposed at this point. It is noted that, for the sake of brevity, the detailed structure of interconnection structures of the dies 150a-150d of the die stack structure 150 are not specifically shown in the figures hereinafter.

Figure 3B:
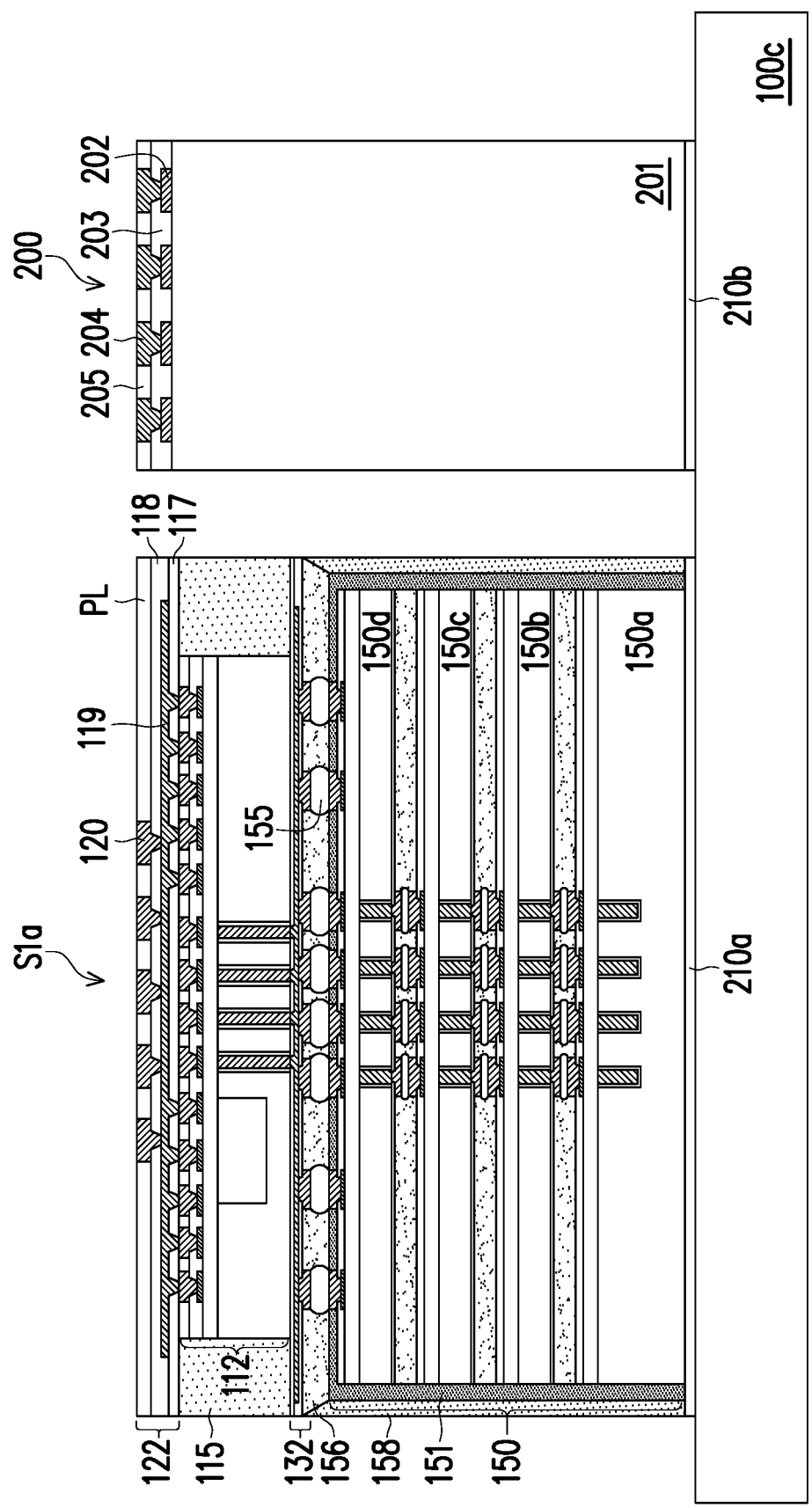

Referring to FIG. 3A and FIG. 3B, the carrier 100b is then released from the overlying structure, and the adhesive layer 124 may be removed by a cleaning process. In some embodiments, a singulation process may be performed to form singulated semiconductor structure S1a. Thereafter, one or more semiconductor structure S1a may be mounted to another temporary carrier 100c through pick-and-place processes. In addition, one or more die 200 is mounted to the carrier 100c through pick-and-place processes. The die(s) 200 may be an application-specific integrated circuit (ASIC) chip, a system on chip (SoC), an analog chip, a sensor chip, a wireless and radio frequency chip, a voltage regulator chip or a memory chip or the like or combinations thereof. In an embodiment, the die stack structure 150 of the semiconductor structure S1a is a memory die stack structure, the die 112 of the semiconductor structure S1a is a logic die, and the die 200 is a SoC. However, the disclosure is not limited thereto.

In some embodiments, the structure of the die 200 is similar to the aforementioned dies. For example, the die 200 includes a semiconductor substrate 201, a plurality of pads 202, a passivation layer 203, a plurality of connectors 204, and a passivation layer 205. A plurality of devices (not shown) may be formed in and/or on the substrate 201. The devices may include active devices, passive devices, or combinations thereof, such as transistors, capacitors, resistors, diodes, photodiodes, fuse devices, or the like, or combinations thereof. An interconnection structure (not shown) may be formed over the substrate 201 to connect the devices to form a function circuit. The pads 202 are electrically connected to the interconnection structure and partially covered by the passivation layer 203. The connectors 204 are formed on the pads 202 exposed by the passivation layer 203 and electrically connected to the pads 202. The passivation layer 205 is formed on the passivation layer 203 and laterally aside the connectors 204. In some embodiments, the top surface of the passivation layer 205 and the top surfaces of the connectors 204 may be substantially coplanar with each other. The materials and structures of the substrate 201, the interconnection structure, the pads 202, the passivation layer 203, the connectors 204 and the passivation layer 205 are similar to those of the die 112, which are not described again here.

In some embodiments, the semiconductor structure S1a is attached to the carrier 100c through an adhesive layer 210a, and the die 200 is attached to the carrier 100c through an adhesive layer 210b. The materials of the adhesive layer 210a and 210b are similar to the material of the adhesive layer 101. The semiconductor structure S1a and the die 200 may be mounted to the carrier 100c with the active surfaces (i.e. front surfaces) thereof facing upward. In some embodiments, the adhesive layers 210a and 210b are respectively applied to the back surfaces of the semiconductor structure S1a and the die 200, and then the semiconductor structure S1a and the die 200 are attached to the carrier 100c through the adhesive layers. It is noted that, the front surface of the semiconductor structure S1a refers to the top surfaces of the RDL structure 122 having the redistribution layers 120, and the back surface of the semiconductor structure S1a refers to a surface opposite to the front surface. The back surface of the semiconductor structure S1a may be surfaces of the encapsulants 151, 158 and the surface of the substrate of the die 150a.

In some embodiments, the adhesive layers 210a and 210b have sizes similar to the sizes of the back surfaces of the semiconductor structure S1a and the die 200, respectively. In alternative embodiments, an adhesive layer may be applied to carrier 100c and substantially cover the whole top surface of the carrier 100c, and then the semiconductor structure S1a and the die 200 are attached to the carrier 100c through the adhesive layer. Other suitable mounting method may also be used. The heights of the semiconductor structure S1a and the die 200 may be the same or different.

Figure 3C:
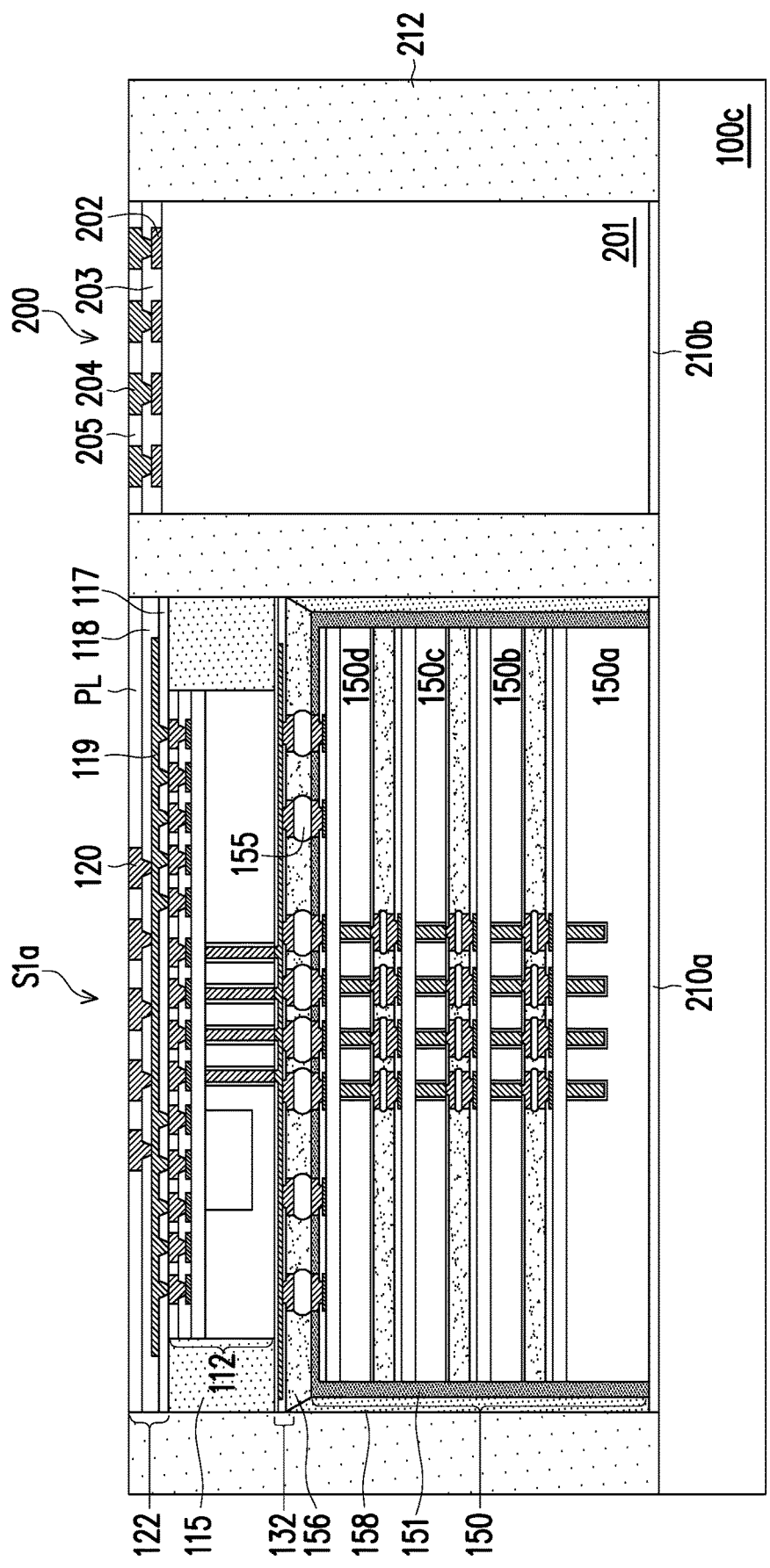

Referring to FIG. 3C, an encapsulant 212 is formed on the carrier 100c to laterally encapsulate sidewalls of the semiconductor structure S1a and the die 200. In some embodiments in which the adhesive layers are respectively disposed on back surfaces of the semiconductor structure S1a and the die 200, the encapsulant 212 further encapsulates sidewalls of the adhesive layers 210a and 210b. The material and forming method of the encapsulant 212 are substantially the same as those of the encapsulant 158. For example, the encapsulant 212 is a molding compound including a base material and fillers distributed in the base material. The encapsulant 212 may be formed by an over-molding process and a planarization process. For example, an encapsulant material layer is formed on the carrier 100c to encapsulant sidewalls and top surfaces of the semiconductor structure S1a and the die 200. Thereafter, the planarization process such as CMP process is performed to at least remove a portion of the encapsulant material layer over the top surfaces of the semiconductor structure S1a and the die 200, so as to expose the redistribution layers 120 of the semiconductor structure S1a and the connectors 204 of the die 200. In some embodiments, the redistribution layers 120 may also be referred to as conductive connectors or pads of the semiconductor structure S1a. In some embodiments in which the semiconductor structure S1a and the die 200 have different heights, the planarization process may further remove a portion of the semiconductor structure S1a and/or a portion of the die 200 to planarize the top surfaces of the semiconductor structure S1a and the die 200.

In some embodiments, after performing the planarization process, the top surface of the encapsulant 212, the top surface of the semiconductor structure S1a and the top surface of the die 200 are substantially coplanar with each other.

Figure 3D:
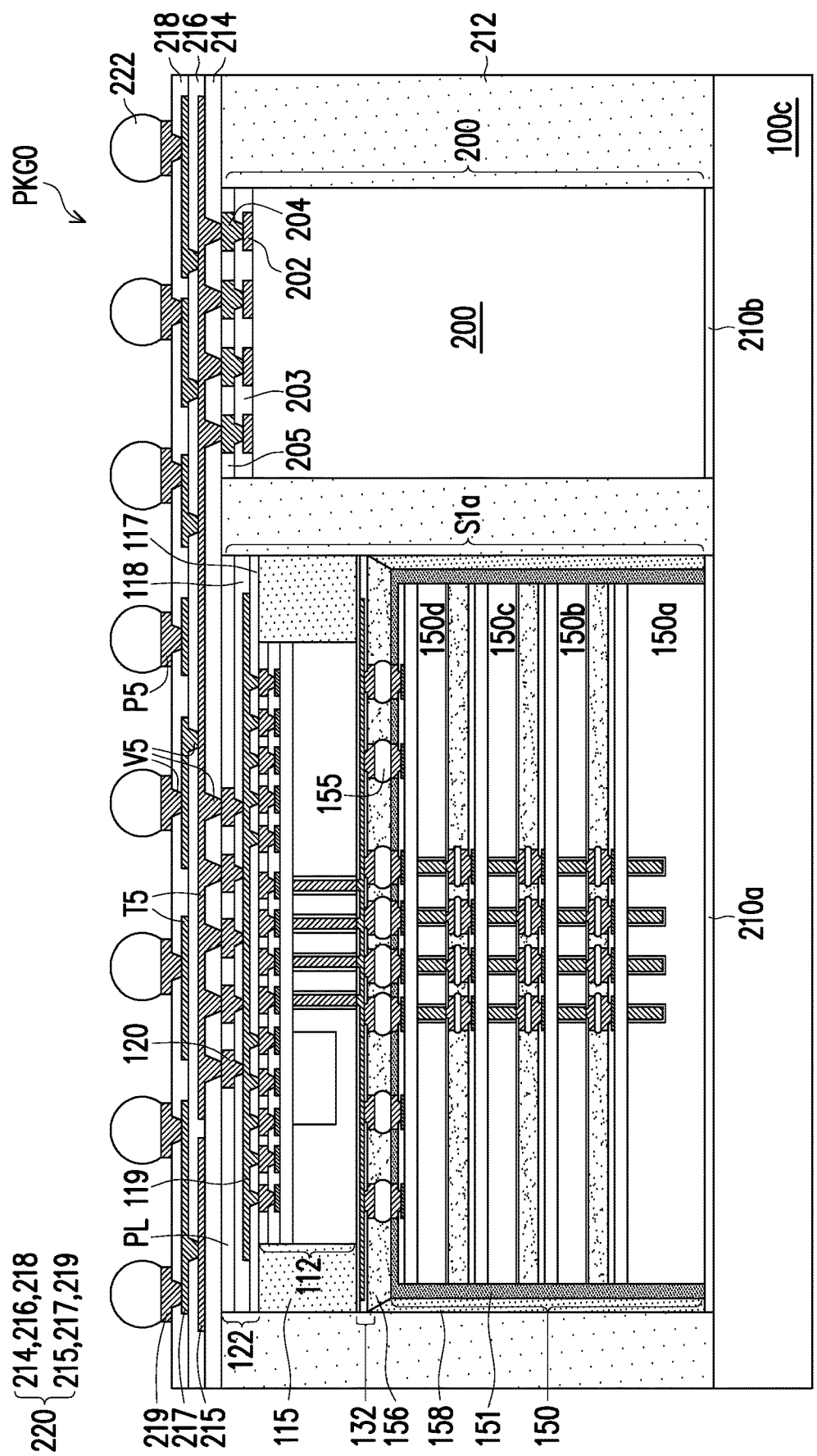

Referring to FIG. 3D, in some embodiments, a RDL structure 220 is then formed on the semiconductor structure S1a, the die 200 and the encapsulant 212 and electrically connected to semiconductor structure S1a and the die 200. The RDL structure 220 is a fan-out RDL structure, and includes a plurality of redistribution layers and polymer layers stacked upon one another. The structure, forming method and materials of the RDL structure 220 are similar to those of the RDL structure 122. For example, the RDL structure 220 includes polymer layers 214, 216, 218 and redistribution layers 215, 217, 219. The redistribution layer 215 penetrates through the polymer layer 214 to be in physical and electrical contact with the redistribution layer 120 of redistribution structure 122 of the semiconductor structure S1a and the connectors 204 of the die 200. The redistribution layer 217 penetrates through the polymer layer 216 to be in physical contact with the redistribution layer 215. The redistribution layer 219 penetrates through the polymer layer 218 to be in physical and electrical contact with the redistribution layer 217.

In some embodiments, the redistribution layers 215 and 217 respectively include vias V5 and traces T5 connected to each other. The vias V5 of the redistribution layer 215 are embedded in and penetrates through the polymer layer 214 to connect the traces T5 to the redistribution layer 120 of the semiconductor structure S1a and the connectors 204 of the die 200. The vias V5 of the redistribution layer 217 are embedded in and penetrates through the polymer layer 216 to connect the traces T5 of the redistribution layers 217 and 215. The traces T5 are respectively located on the polymer layers 214 and 216, and are respectively extending on the top surfaces of the polymer layers 214 and 216.

The redistribution layer 219 includes vias V5 and protruding portions P5. The vias V5 are embedded in and penetrates through the polymer layer 218 to connect the protruding portions P5 to the traces T5 of the redistribution layer 217. The protruding portions P5 may be conductive pillars. The sidewalls of the vias V5 and the traces T5 may be straight or inclined. In some embodiments, the sidewalls of the vias V5 are inclined and the vias V5 may be tapered toward the semiconductor structure S1a and the die 200. In some embodiments, the redistribution layer 219 may include conductive pillars or under bump metallurgy pattern.

Still referring to FIG. 3D, a plurality of connectors 222 may be formed on the RDL structure 220. For example, the connectors 222 are formed on and electrically connected to the redistribution layer 219 of the RDL structure 220. In some embodiments, the connectors 222 may be solder balls, C4 bumps, BGAs, or the like, or combinations thereof. In some embodiments, the material of the connector 222 includes copper, aluminum, lead-free alloys (e.g., gold, tin, silver, aluminum, or copper alloys) or lead alloys (e.g., lead-tin alloys). The connector 222 may be formed by a suitable process such as evaporation, plating, ball dropping, screen printing and reflow process, a ball mounting process or a C4 process. The connectors 222 may also be referred to as conductive terminals.

A package structure PKG0 is thus formed on the carrier 100c. The package structure PKG0 includes the semiconductor structure S1a, the die 200, the encapsulant 212, the RDL structure 220 and the connectors 222. The semiconductor structure S1a and the die 200 are electrically coupled to each other through the RDL structure 220. The connectors 222 are electrically connected to the semiconductor structure S1a and the die 200 through the RDL structure 220.

In some embodiments, a plurality of encapsulants are included in the package structure PKG0. For example, as shown in FIG. 3D, the die stack structure 150 includes the encapsulant 151 laterally encapsulating sidewalls of the dies 150a-150d, the encapsulant 158 laterally encapsulates sidewalls of the die stack structure 150 and contact the encapsulant 151. The encapsulant 115 laterally encapsulates sidewalls of the die 112 and may be separated from the encapsulants 151 and 158 by the RDL structure 132 therebetween. The encapsulant 212 laterally encapsulates the semiconductor structure S1a and the die 200. The encapsulant 212 is in contact with the encapsulants 115 and 158. In the present embodiment, the sidewalls of the die 112 are encapsulated by and in contact with the encapsulant 115, and are separated from the encapsulant 212 by the encapsulant 115 therebetween. Interfaces are existed between the encapsulant 115 and the encapsulant 212, and between the encapsulant 158 and the encapsulant 212. The sidewalls of the dies 150a-150d are encapsulated by and in contact with the encapsulant 151, but the disclosure is not limited thereto. In alternative embodiments, the encapsulant 151 and/or the encapsulant 158 may be omitted, and the sidewalls of the dies 150a-150d may be encapsulated by and in contact with the encapsulant 158 or the encapsulant 212.

Figure 10:
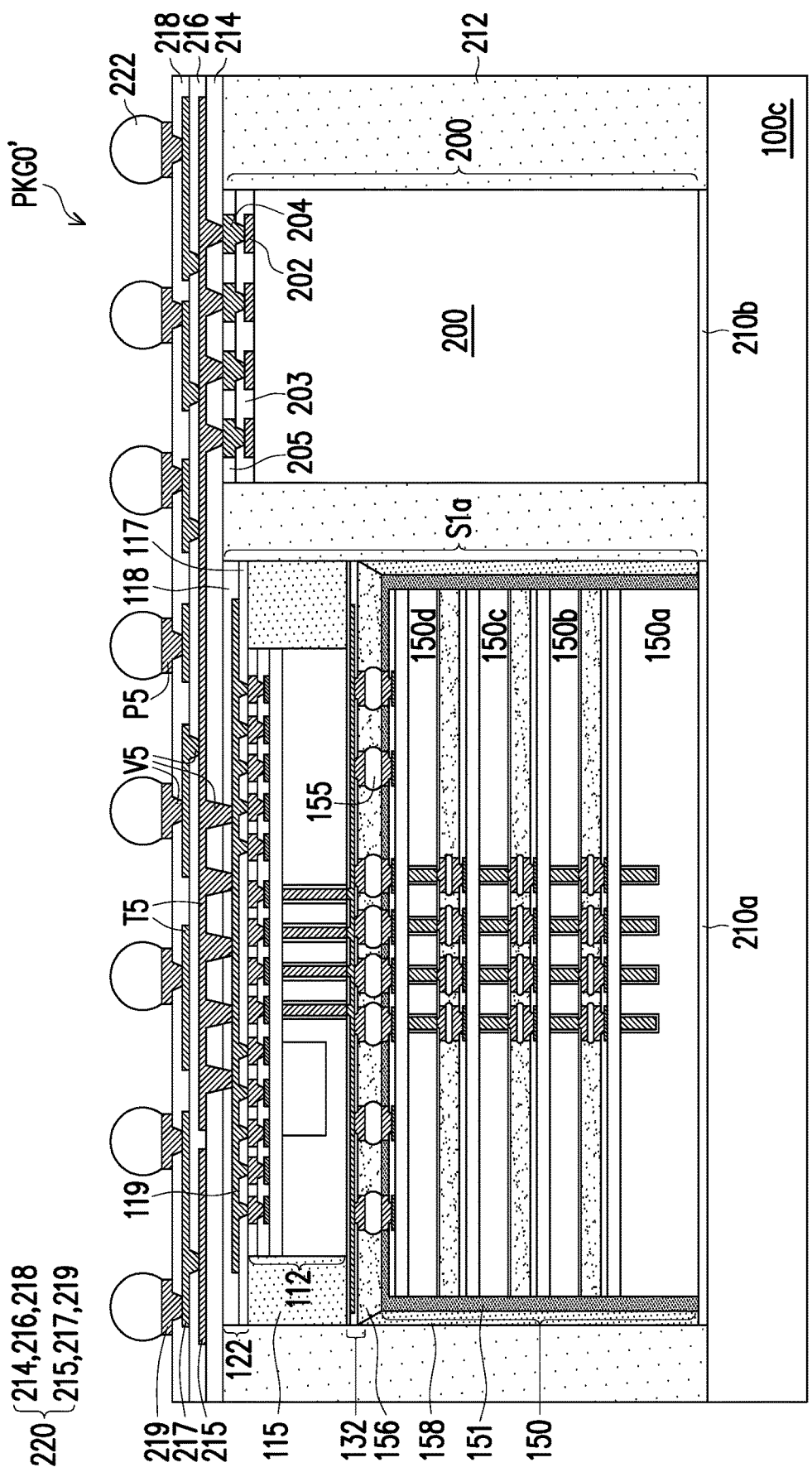

FIG. 10 illustrates a package structure PKG0' according to an alternative embodiment in which the redistribution layer 120 and the polymer layer PL (FIG. 3D) are omitted, as shown in FIG. 10, the redistribution layer 215 penetrates through the polymer layer 214 and further penetrates through the polymer layer 118 of the semiconductor structure S1a to connect to the redistribution layer 119. In such embodiments, the vias V5 of the redistribution layer 215 are landing on the redistribution layer 119. The other structural features of the package structure PKG0' are substantially the same as those of the package structure PKG0, which are not described again here. Thereafter, the package structure PKG0/PKG0' may be further coupled to other package component. The details are described below taken the package structure PKG0 as an example.

Referring back to FIG. 3D and FIG. 3E, after the package structure PKG0 is formed on the carrier 100c, a de-bonding process is performed to release the carrier 100c form the overlying package structure PKG0. In some embodiments, the package structure PKG0 may be further coupled to other package component to form a package structure PKG1. For example, the package structure PKG0 may be electrically coupled to a package substrate 230 through the connectors 222. The package substrate 230 may be a circuit substrate, such as a printed circuit board (PCB).

For example, the package substrate 230 includes an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may also be used for the package substrate 230.

In some embodiments, the package substrate 230 includes a plurality of conductive features MS interconnected to each other. The conductive features MS may include multi-layers of conductive lines and conductive vias. The material of the conductive features MS may include copper, aluminum, or other suitable metallic materials or combinations thereof.

In some embodiments, the package substrate 230 may include conductive pads (not shown) on the top surface thereof, and the conductive pads are electrically connected to the conductive features MS. The connectors 222 of the package structure PKG0 may be electrically bonded to the conductive pads of the package structure 230 on the top surface thereof.

Figure 3E:
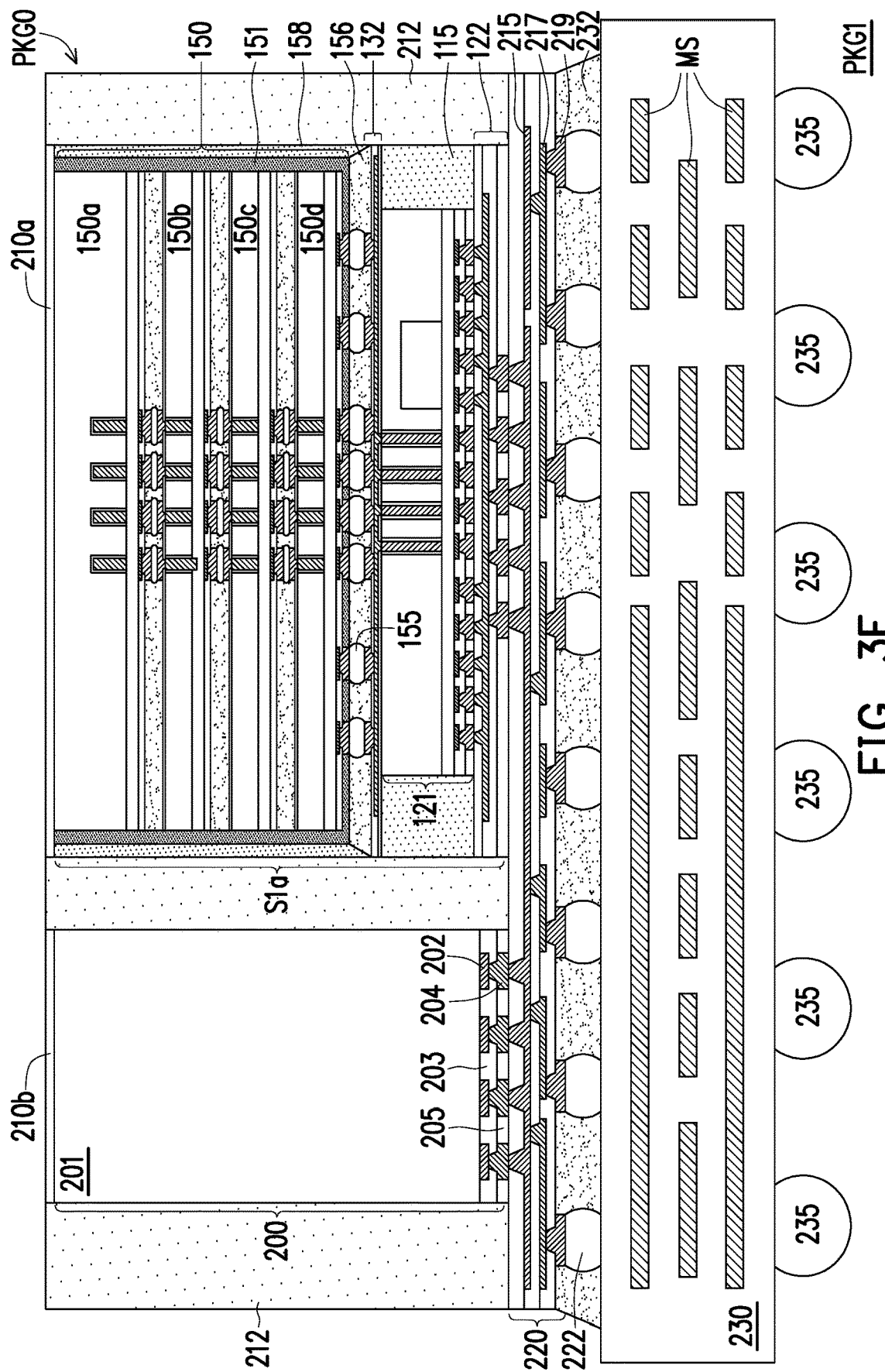

Still referring to FIG. 3E, in some embodiments, a plurality of connectors 235 are disposed on the bottom surface of the package substrate 230 for further electrical connection. The connectors 235 may be BGA balls. The connectors 235 are electrically connected to the substrate 230 and further electrically connected to the package structure PKG0 through the package substrate 230.

In some embodiments, after the package structure PKG0 is bonded to the package substrate 230, an underfill layer 232 is formed to fill the space between the package structure PKG0 and the package substrate 230 and laterally surrounds the connectors 222.

Many variations and/or modifications may be made to the embodiments of package structure of the disclosure. FIG. 4 to FIG. 9 illustrates some package structures according to some embodiments of the disclosure.

Figure 4:
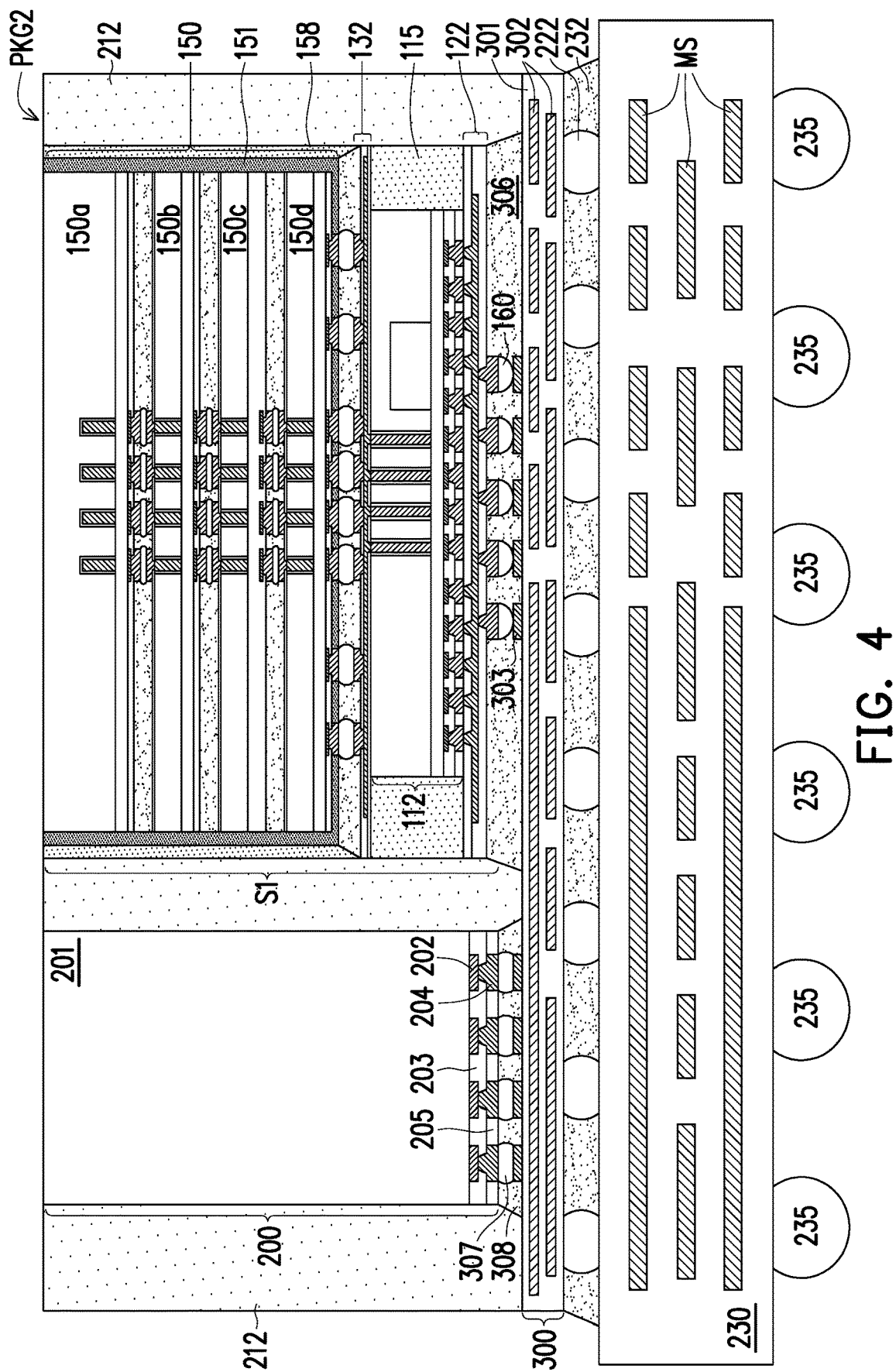
FIG. 4 to FIG. 10 are schematic cross-sectional views illustrating package structures according to some other embodiments of the disclosure.

FIG. 4 illustrates a package structure PKG2 which is similar to the package structure PKG1, except that the semiconductor S1a is replace by the semiconductor structure S1, and the RDL structure 220 is replaced by an RDL interposer 300, and the semiconductor structure S1 and the die 200 are electrically bonded to an RDL interposer 300 through connectors. In some embodiments, the structure of the RDL interposer 300 may be similar to that of the RDL structure 220 (FIG. 3E). The difference lies in that the RDL interposer 300 is pre-formed before being connected to the semiconductor structure S1 and the die 200.

Referring to FIG. 4, in some embodiments, the RDL interposer 300 includes a dielectric structure 301, a plurality of redistribution layers 302 and a plurality of conductive pads 303. The dielectric structure 301 may include one or more dielectric layers. The dielectric structure 301 may include inorganic dielectric materials such as silicon oxide, silicon nitride, polymer materials such as PI, PBO, BCB or combinations thereof. The redistribution layers 302 are embedded in the dielectric structure 301 and are interconnected to each other. Similar to the above-described redistribution layer, the redistribution layers 302 includes a plurality of conductive traces and conductive vias (not shown) connected to each other. The conductive pads 303 are disposed at the top surface of the RDL interposer 300 and electrically connected to the redistribution layers 302. The conductive pads 303 are at least partially exposed at the top surface of the RDL interposer 300 for further electrical connection. In some embodiments, a plurality of conductive pads (not shown) may also be disposed at the bottom surface of the RDL interposer.

Still referring to FIG. 4, the semiconductor structure S1 is electrically bonded to the RDL interposer 300 through the connectors 160. For example, the connectors 160 of the semiconductor structure S1 are electrically connected to some of the conductive pads 303 of the RDL interposer 300. In some embodiments, the die 200 is electrically boned to the RDL interposer 300 through a plurality of connectors 307. For example, the connectors 204 of the die 200 are electrically bonded to some of the conductive pads 303 of the RDL interposer 300 through the connectors 307. The materials of the connectors 307 are similar to, and may be the same as or different from those of the connectors 160. For example, the connectors 307 may be micro bumps such as solder bumps.

In some embodiments, an underfill layer 306 is formed to fill the space between the semiconductor structure S1 and the RDL interposer 300. An underfill layer 308 is formed to fill the space between the die 200 and the RDL interposer 300. The underfill layer 306 and the underfill layer 308 may be spaced from each other. In alternative embodiment, the underfill layer 306 and the underfill layer 308 may be merged with and contact each other.

In the present embodiment, the encapsulant 212 is formed on the RDL interposer 300 to laterally encapsulant the semiconductor structure S1, the die 200 and the underfill layers 306 and 308 after bonding the die 200 and the semiconductor structure S1 to the RDL interposer 300. In some embodiments, the structure may further be coupled to the substrate 230 through connectors 222. The connectors 222 are disposed between the RDL interposer 300 and the substrate 230 to provide the electrical connection, and an underfill layer 232 is disposed to fill the space between the RDL interposer 300 and the package substrate 230. The other features of the package structure PKG2 are similar to those of the package structure PKG1.

Figure 5:
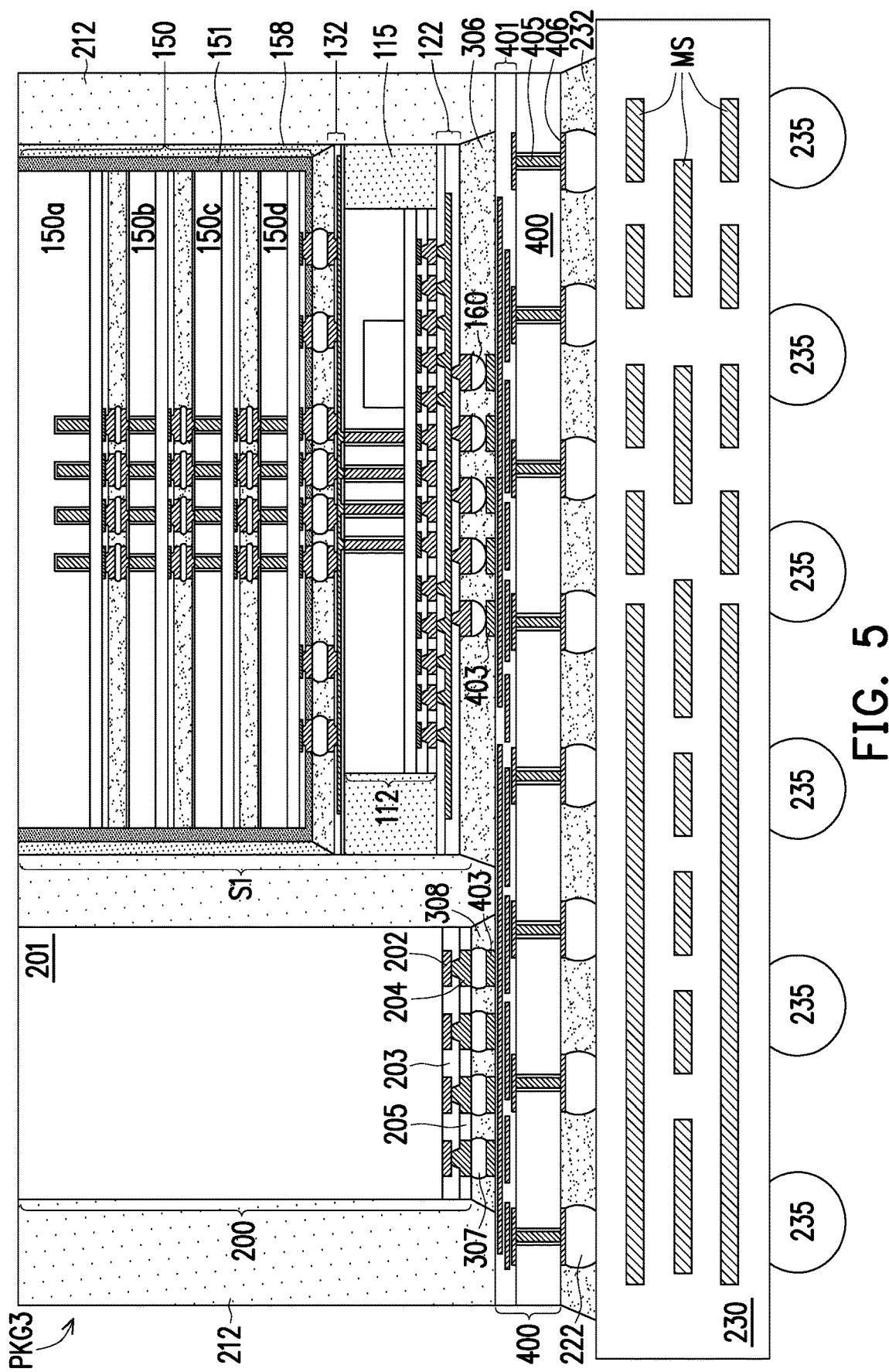

FIG. 5 illustrates a package structure PKG3 which is similar to the package structure PKG2, except that the RDL interposer 300 is replaced by a semiconductor interposer 410. The semiconductor structure S1 and the die 200 are electrically bonded to the semiconductor interposer 410 and further electrically coupled to the substrate 230 through the semiconductor interposer 410.

Referring to FIG. 5, in some embodiments, the die 200 and the semiconductor structure S1 are electrically bonded to the semiconductor interposer 410. The semiconductor interposer 410 may also be referred to as an interposer wafer. In some embodiments, the semiconductor interposer 410 includes a substrate 400, an interconnection structure 401, conductive connectors 403, TSVs 405 and conductive pads 406. The materials and structure of the semiconductor interposer 410 are similar to those of above-described dies 150a-150d or the die 112. For example, the substrate 400 is a semiconductor substrate, such as a silicon substrate. In the embodiments in which the substrate 400 includes silicon, the interposer 400 may also be referred to as a silicon interposer. The interconnection structure 401 includes multiple conductive features embedded in a dielectric structure and interconnected to each other. The conductive connectors 403 are formed on and electrically connected to the interconnection structure 401. The TSVs 405 are embedded in the substrate 400 and electrically connected to the interconnection structure 401. Dielectric liners may be disposed between the TSVs 405 and the substrate 400 to separate the TSVs 405 from the substrate 400. The conductive pads 406 are formed on the bottom surface (i.e. back surface) of the substrate 400 and electrically connected to the TSVs 405. In some embodiment, an isolation layer (not shown) is disposed between the substrate 400 and the conductive pads 406 to separate the conductive pads 406 from the substrate 400. In some embodiments, the semiconductor interposer 410 is free of devices. In alternative embodiments, the semiconductor interposer 410 may include active devices, or passive devices, or combinations thereof.

In the present embodiment, the die 200 and the semiconductor structure S1 are electrically bonded to the conductive connectors 403 of the interposer 400 through the connectors 160 and 307, respectively. The die 200 and the semiconductor structure S1 are electrically coupled to each other through the interposer 400. The connectors 222 are electrically connected to the conductive pads 406 of the interposer 400 and provide the electrical connection between the interposer 400 and the package substrate 230.

Figure 6:
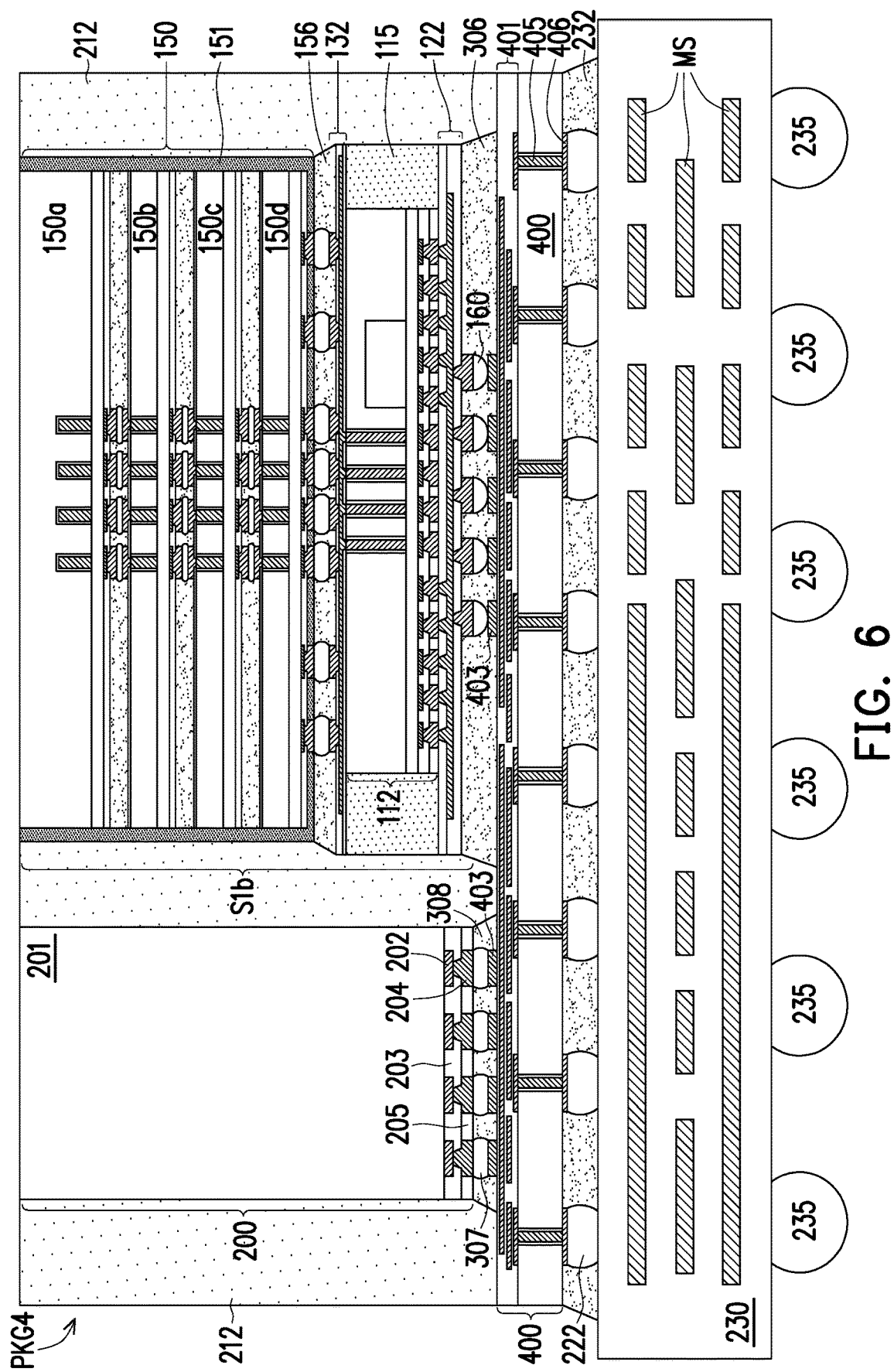

FIG. 6 illustrates a package structure PKG4 which is similar to the package structure PKG3, except that a semiconductor structure S1b is integrated with the die 200, and the encapsulant 158 of the semiconductor structure S1 is omitted in semiconductor structure S1b.

In some embodiments, the encapsulation step of the die stack structure 150 shown in FIG. 1G is omitted, and the encapsulation of the die stack structure 150 is implemented in the step of forming the encapsulant 212. As shown in FIG. 6, a portion of the encapsulant 212 is located on the RDL structure 132 to laterally encapsulate and contact sidewalls of the underfill layer 156 and sidewalls of the die stack structure 150. In some embodiments, the encapsulant 212 is in contact with the encapsulant 151 of the die stack structure 150. In alternative embodiments, the encapsulant 151 of the die stack structure 150 may also be omitted, and the encapsulant 212 may directly encapsulates and contacts sidewalls of the dies 150a-150d and sidewalls of the underfill layers 148 of the die stack structure 150.

Figure 7:
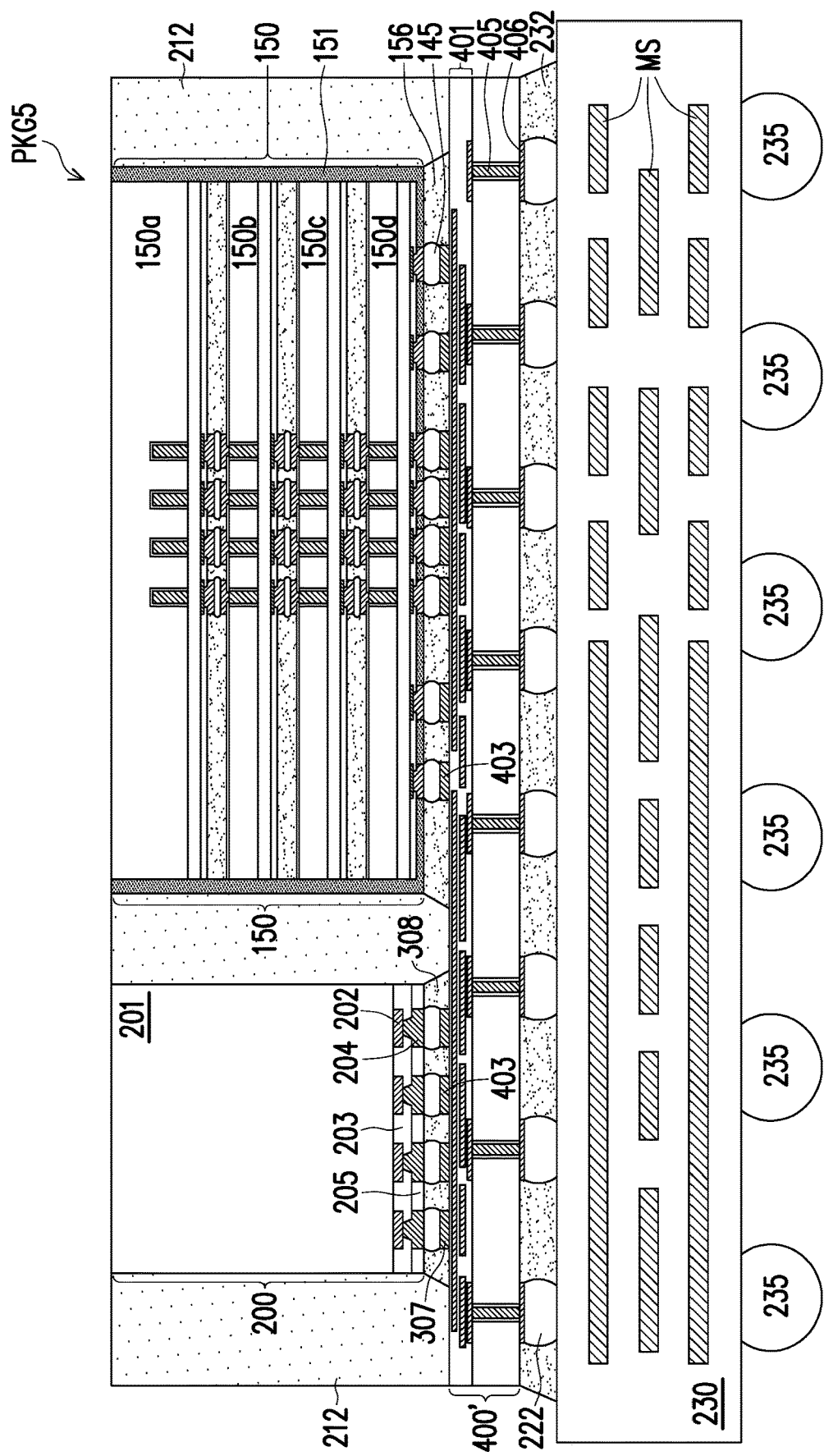

FIG. 7 illustrates a package structure PKG5 which is similar to the package structure PKG4 except that the interposer of the package structure PKG5 is an active interposer, and the die stack structure 150 is directly bonded to the active interposer.

Referring to FIG. 7, in some embodiments, the die stack structure 150 and the die 200 are electrically bonded to the interposer 400' through connectors 145 and 307, respectively. In some embodiments, the interposer 400' include active devices such as transistors, memory devices, or the like. Passive devices may also be included in the interposer 400'. Since the interposer 400' includes active devices, it may be referred to as an active interposer. The interposer 400' may perform both of the functions of the aforementioned interposer 400 and the die 112. For example, the interposer 400' is a die of a same type as the die 112 and has a structure similar to the interposer 400. In some embodiments, the interposer 400' is a logic die configured to perform read, program, erase, and/or other operations, and the die stack structure 150 is a memory stack including memory dies (i.e. DRAM memory die) stacked upon one another and programmed and controlled by the interposer 400'. On the other hand, the die stack structure 150 is integrated with the die 200 by electrically coupling to the die 200 through the interposer 400'.

Figure 8:
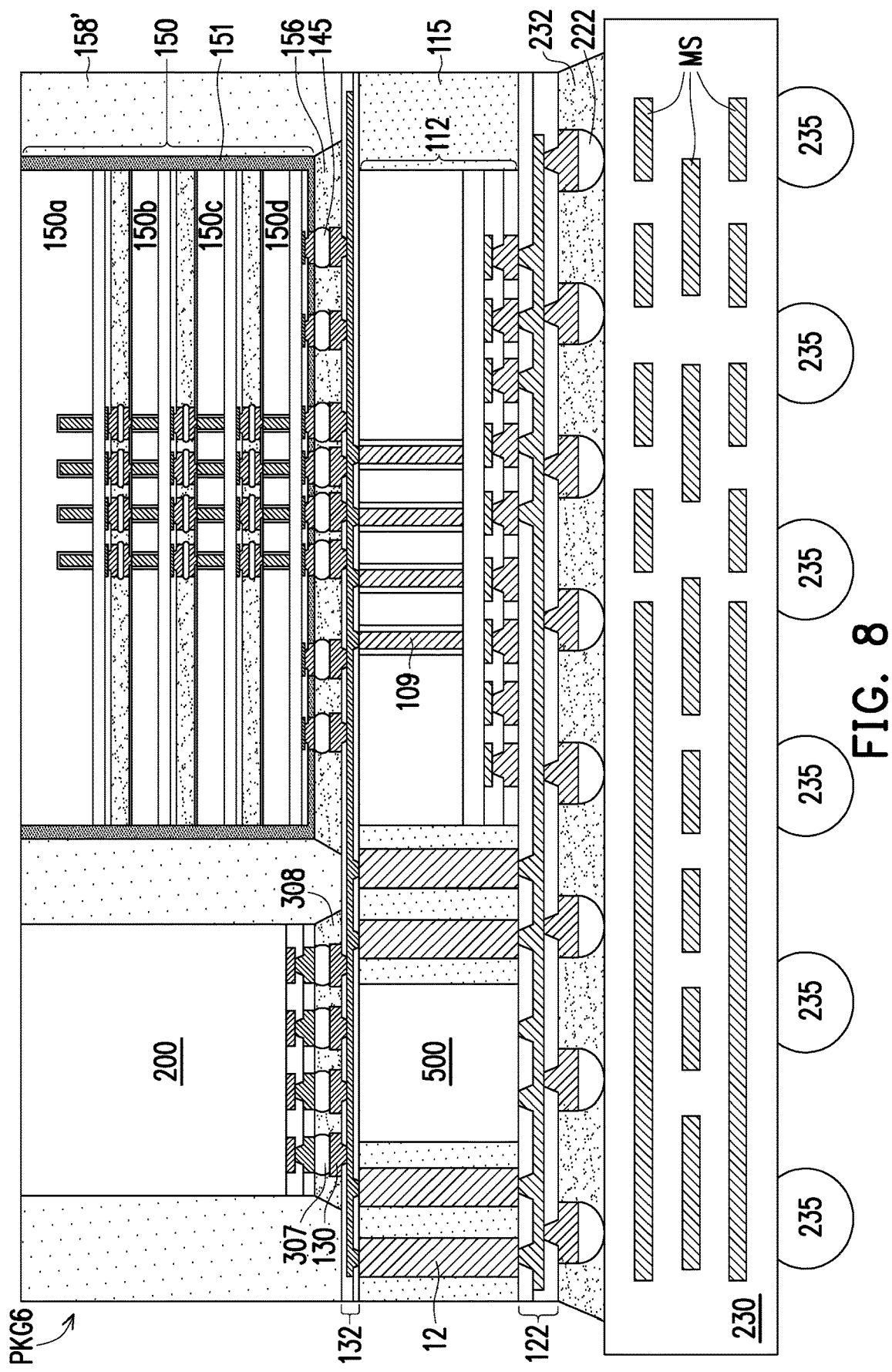

FIG. 8 illustrates a package structure PKG6 according to some other embodiments of the disclosure. In some embodiments, the integration of the die stack structure 150 with the die 200 may be implemented in the step of FIG. 1F (i.e. the step of electrically connecting the die stack structure 150 to the RDL structure 132).

Referring to FIG. 8, in some embodiments, the die stack structure 150 is electrically bonded to the RDL structure 132 through connectors 145, while the die 200 is disposed laterally aside the die stack structure 150 and electrically bonded to the RDL structure 132 through the connectors 307. In the present embodiment, the underfill layer 308 is formed to fill the space between the die 200 and the RDL structure 132. The underfill layer 308 laterally surrounds the connectors 307 and some of the redistribution layers 130 under the die 200.

In some embodiments, a passive device 500 may be disposed laterally aside the die 112 to be integrated with the die 112, the die stack structure 150 and the die 200. The passive device 500 may be integrated passive device (IPD), or the like. In some embodiments, the integration of IPD may improve the power integrity performance of the die (e.g. SoC) or the package. In some embodiments, the passive device 500 may include conductive connectors (not shown) electrically connected to the RDL structure 122. In further embodiments, the passive device 500 may also include conductive vias (now shown) embedded in substrate and connected to the RDL structure 132. The TIVs 12 may be formed laterally aside the passive device 500 and the die 112 to provide electrical connection. The encapsulant 115 encapsulates sidewalls of the die 112, the passive device 500 and the TIVs 12. The passive device 500 is electrically coupled to the die 112 through the RDL structure 122. The RDL structure 132 is electrically connected to the passive device 500 and the die 112 through the TIVs 501 and the RDL structure 122 and the TSVs 109 of the die 112. The die 200 and the die stack structure 150 are electrically coupled to the passive device 500 and the die 112 through the RDL structure 132. The encapsulant 158' is formed on the RDL structure 132 to laterally encapsulate the die 200, the underfill layer 308, the die stack structure 150 and the underfill layer 156.

Figure 9:
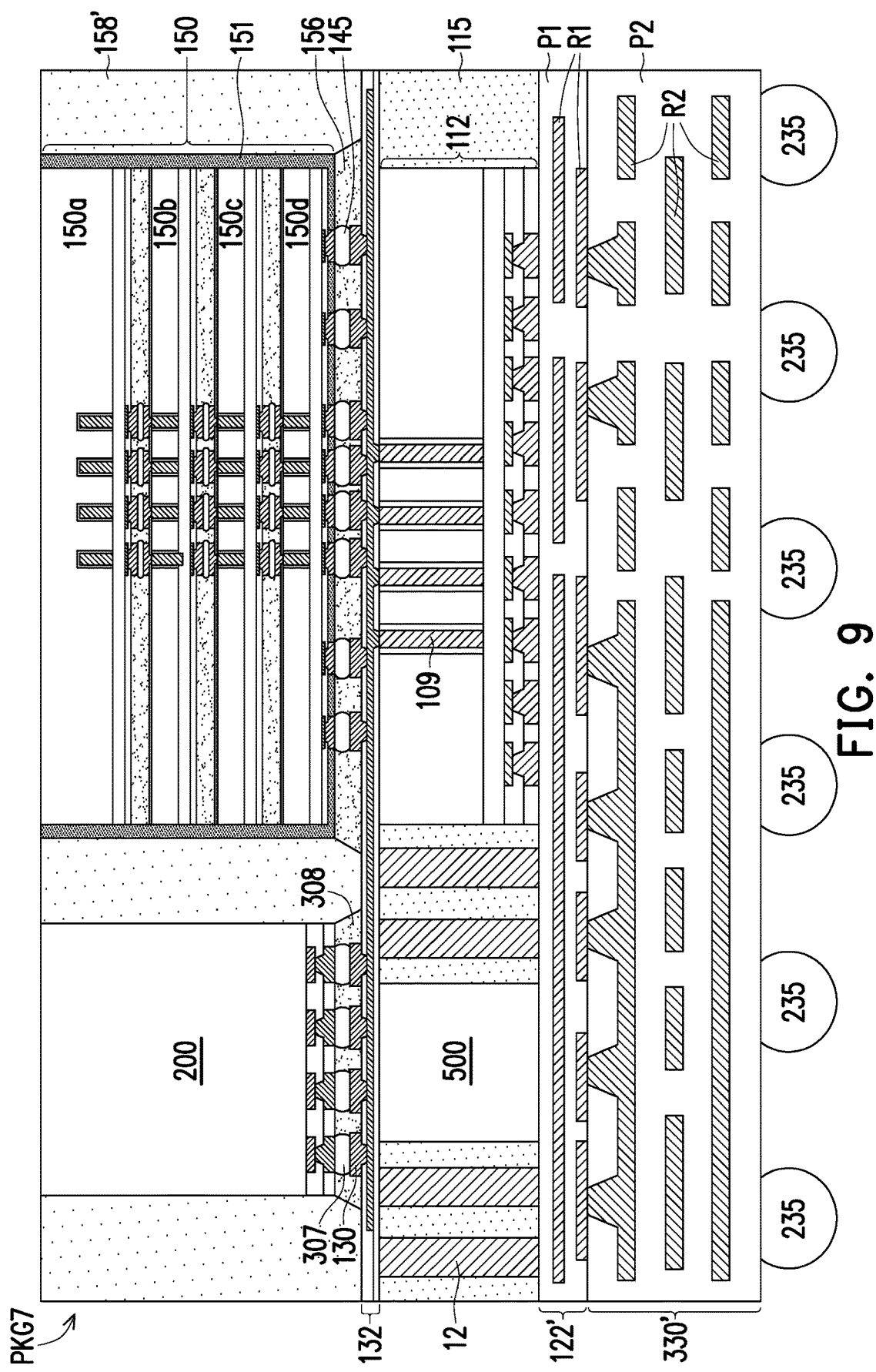

FIG. 9 illustrates a package structure PKG7 which is similar to the package structure PKG6, except that the package substrate 230 is replaced by a RDL structure 330', and the RDL structure 330' is directly formed on and electrically connected to a RDL structure 122'.

Referring to FIG. 1B and FIG. 10, in some embodiments, in the step of FIG. 1B, a RDL structure 122' is formed on and electrically connected to the die 112, the passive device 500, and the TIVs 12. The RDL structure 122' includes a plurality of redistribution layers R1 embedded in a polymer structure P1. Thereafter, the RDL structure 330' is formed on the RDL structure 122'. The RDL structure 330' includes a plurality of redistribution layers R2 embedded in a polymer structure P2. The structure, forming method and materials of the RDL structures 122' and 330 are similar to those described above.

In some embodiments, the thickness of the RDL structure 330' may be greater than the thickness of the RDL structure 122'. The redistribution layer R2 of the RDL structure 330' may be thicker than the redistribution layer R1, and the pitch of the redistribution layer R1 of the RDL structure 122' may be less than the pitch of the redistribution layer R2 of the RDL structure 330'. In some embodiments, through directly forming the RDL structure 330' on the RDL structure 122', the electrical performance of the package structure is enhanced.

It is noted that, various embodiments of the disclosure may be applied in combination. For example, each of the semiconductor structures S1-S9 may be applied in any one the package structures PKG0-PKG7.

In accordance with some embodiments of the disclosure, a package structure includes a first die, a first encapsulant, a first RDL structure, a die stack structure and a second encapsulant. The first encapsulant laterally encapsulates the first die. The first RDL structure is electrically connected to the first die, and disposed on a first side of the first die and the first encapsulant. The die stack structure is electrically connected to the first die and disposed on a second side of the first die opposite to the first side. The second encapsulant is located over the first encapsulant and laterally encapsulating the die stack structure. A sidewall of the first encapsulant is aligned with a sidewall of the second encapsulant.

In accordance with alternative embodiments of the disclosure, a package structure includes a first die, a die stack structure, an additional die and a first encapsulant. The die stack structure is disposed on and electrically connected to the first die. The additional die is laterally aside the die stack structure and electrically coupled to the first die and the die stack structure. The first encapsulant is at least laterally encapsulating the die stack structure and the additional die. A sidewall of the first die is separated from the first encapsulant.

In accordance with some embodiments of the disclosure, a method of forming a package structure includes the following processes. A first package structure is formed by the following processes. A first die is provided. A first encapsulant is formed to laterally encapsulate the first die. A first RDL structure is formed on a first side of the first die. A die stack structure is electrically connected to the first die. The die stack structure is disposed on a second side of the first die opposing the first side.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a first die;
   a first encapsulant, laterally encapsulating the first die;
   a first redistribution layer (RDL) structure electrically connected to the first die, and disposed on a first side of the first die and the first encapsulant;
   a die stack structure electrically connected to the first die and disposed on a second side of the first die opposite to the first side;
   a semiconductor component laterally aside the first die and encapsulated by the first encapsulant, wherein the semiconductor component comprises a semiconductor die or a passive device, the die stack structure and the first die are electrically coupled to the semiconductor component; and
   a second encapsulant over the first encapsulant and laterally encapsulating the die stack structure,
   wherein a sidewall of the first encapsulant is aligned with a sidewall of e second encapsulant.

2. The package structure of claim 1, further comprising a second RDL structure on the second side of the first die and on a top surface of the first encapsulant, wherein the die stack structure is electrically connected to the first die through the second RDL structure.

3. The package structure of claim 1, wherein a width of the first die is less than a width of the die stack structure.

4. The package structure of claim 1, wherein the first encapsulant comprises a base material and a plurality of fillers in the base material, some of the fillers at a bottom of the first encapsulant have planar bottom surfaces coplanar with a bottom surface of the first die.

5. The package structure of claim 1, wherein the die stack structure comprises a die which is an integrated passive device or a capacitor.

6. The package structure of claim 1, wherein the die stack structure comprises:
   a plurality tiers of second dies;
   a plurality of through integrated fan-out vias (TIVs) laterally aside the second dies; and
   a plurality of RDL structures between adjacent tiers of the second dies;
   wherein the second dies are electrically connected to each other through the RDL structures and the TIVs.

7. The package structure of claim 1, wherein the die stack structure comprises an integrated passive device stacked on a plurality of second dies.

8. The package structure of claim 1, further comprising a semiconductor die or an additional die stack stricture laterally aside the die stack structure and electrically coupled to the die stack structure and the first die.

9. The package structure of claim 1, further comprising a TIV laterally aside the first die and encapsulated by the first encapsulant, and the TIV is electrically connected to the first RDL structure.

10. A package structure, comprising:
    a first die;
    a die stack structure disposed on and electrically connected to the first die;
    an additional die, laterally aside the die stack structure and electrically coupled to the first die and the die stack structure;
    a first encapsulant, at least laterally encapsulating the die stack structure and the additional die, wherein a sidewall of the first die is separated from the first encapsulant; and
    a second encapsulant, laterally encapsulating a sidewall of the die stack structure and laterally encapsulated by the first encapsulant.

11. The package structure of claim 10, further comprising:
    a third encapsulant, laterally encapsulating the sidewall of the first die and laterally encapsulated by the first encapsulant;
    a first RDL structure under the first die and the third encapsulant and electrically connected to the first die and the die stack structure, wherein the first RDL structure and the first die are laterally aside the additional die; and
    a second RDL structure or an interposer under the first die, the die stack structure, the addition die and the first encapsulant, wherein the additional die is electrically coupled to the first die and the die stack structure through the second RDL structure or the interposer.

12. The package structure of claim 10, further comprising:
a plurality of connectors, disposed between the first die and the die stack structure; and
an underfill layer, laterally surrounding the plurality of connectors.

13. The package structure of claim 10, wherein the first die is an active interposer including active devices, and the active interposer is disposed under the additional die, the die stack structure and the first encapsulant.

14. The package structure of claim 10, further comprising:
a third encapsulant, laterally encapsulating the first die, wherein the die stack structure, the additional die and the first encapsulant are disposed on a first side of the first die; and
a RDL structure on a second side of the first die vertically opposite to the first side,
wherein a sidewall of the first encapsulant is aligned with a sidewall of the third encapsulant.

15. A method of forming a package structure, comprising:
forming a first package structure, comprising:
providing a first die;
forming a first encapsulant to laterally encapsulate the first die;
forming a first RDL structure on a first side of the first die; and
electrically connecting a die stack structure to the first die, wherein the die stack structure is disposed on a second side of the first die opposing the first side;
disposing an additional die laterally aside the first package structure; and
forming a second encapsulant to laterally encapsulate the first package structure and the additional die.

16. The method of claim 15, wherein forming the first package structure further comprising forming a third encapsulant on the first encapsulant to laterally encapsulate the die stack structure, wherein sidewalls of third encapsulant is aligned with sidewalls of the first encapsulant.

17. The method of claim 15, further comprising forming a second RDL structure on the second side of the first die, and electrically connecting the die stack structure to the first die comprises electrically bonding the die stack structure to the second RDL structure, such that the die stack structure is electrically connected to the first die through the second RDL structure.

18. The method of claim 15, further comprising disposing a semiconductor component laterally aside the first die, and the first encapsulant is formed to further encapsulate sidewalls of the semiconductor component.

19. The method of claim 15, further comprising:
forming a second RDL structure on the additional die, the second encapsulant and the first package structure, wherein the additional die and the first package structure are electrically connected to each other through the second RDL structure.

20. The method of claim 15, further comprising:
electrically bonding the first package structure and the additional die to an interposer, such that the first package structure is electrically coupled to the additional die through the interposer; and
forming the second encapsulant on the interposer to laterally encapsulate the first package structure and the additional die.

* * * * *